United States Patent
Omote

(10) Patent No.: US 6,909,338 B2
(45) Date of Patent: Jun. 21, 2005

(54) LADDER-TYPE FILTER, BRANCHING FILTER, AND COMMUNICATION DEVICE

(75) Inventor: Ryoichi Omote, Omihachiman (JP)

(73) Assignee: Murta Manufacturing Co., Ltd., Kyoto (JP)

( * ) Notice: Subject to any disclaimer, the term of this patent is extended or adjusted under 35 U.S.C. 154(b) by 15 days.

(21) Appl. No.: 10/697,530

(22) Filed: Oct. 30, 2003

(65) Prior Publication Data

US 2004/0119561 A1 Jun. 24, 2004

(30) Foreign Application Priority Data

Oct. 30, 2002 (JP) ........................................ 2002-315997
Oct. 10, 2003 (JP) ........................................ 2003-351502

(51) Int. Cl.[7] .............................. H03H 9/64; H03H 9/72
(52) U.S. Cl. ...................... 333/133; 333/189; 333/193; 333/195
(58) Field of Search ................................ 333/186–196, 333/133; 310/313 B, 313 D

(56) References Cited

U.S. PATENT DOCUMENTS

| | | | | |
|---|---|---|---|---|
| 5,789,845 A | * | 8/1998 | Wadaka et al. | 310/334 |
| 5,933,062 A | * | 8/1999 | Kommrusch | 333/193 |
| 5,949,306 A | * | 9/1999 | Hickernell | 333/195 |
| 6,710,677 B2 | * | 3/2004 | Beaudin et al. | 333/133 |
| 6,741,145 B2 | * | 5/2004 | Tikka et al. | 333/133 |
| 2003/0214368 A1 | * | 11/2003 | Taniguchi | 333/133 |
| 2004/0058664 A1 | * | 3/2004 | Yamamoto et al. | 455/339 |
| 2004/0140866 A1 | * | 7/2004 | Taniguchi | 333/133 |

FOREIGN PATENT DOCUMENTS

| | | |
|---|---|---|
| JP | 06-260876 | 9/1994 |
| JP | 09-167937 | 6/1997 |
| JP | 2800905 | 7/1998 |
| JP | 2002-223147 | 8/2002 |
| JP | 2002-319836 | * 10/2002 |

OTHER PUBLICATIONS

C.W. Seabury et al.; "Thin Film ZnO Based Bulk Acoustic Mode Filters", 1997 IEEE Microwave Symposium Digest, vol. 1, pp. 181–184, Jun. 1997.*

* cited by examiner

*Primary Examiner*—Barbara Summons
(74) *Attorney, Agent, or Firm*—Keating & Bennett, LLP

(57) ABSTRACT

In a ladder type filter, a first inductor is connected in series with a parallel resonator. A second inductor is connected in parallel to a series resonator. The resonant point of the parallel resonator having the first inductor connected in series and the anti-resonant point of the series resonator developed on the lower frequency side of the resonant point of the series resonator, caused by the second inductor connected in parallel, substantially coincide with each other.

30 Claims, 31 Drawing Sheets

LADDER-TYPE FILTER, BRANCHING FILTER, AND COMMUNICATION DEVICE

BACKGROUND OF THE INVENTION

1. Field of the Invention

The present invention relates to a ladder-type filter, and in particular, to a ladder type filter for use in mobile communication devices such as automobile telephones, portable telephones and other suitable devices, a branching filter, and a communication device.

2. Description of the Related Art

In recent years, reductions in size and weight of communication devices such as portable telephones have been required, and composite communication devices have been developed. Dielectric filters having superior electrical characteristics and withstand power properties have been used in branching filters and top filters according to known techniques. Recently, surface acoustic wave (SAW) filters having reduced sizes and weights have been more required for the branching filters and the top filters. Especially, for filters which are used on the transmission sides of branching filters, high withstand power properties have been required. Moreover, dielectric filters having low insertion losses in pass-bands and high attenuations outside the pass-band (blocking-band) are in great demand.

Referring to the surface acoustic wave filters used on the transmission sides of branching filters, ladder type filters including one terminal-pair type surface acoustic wave resonators arranged in parallel arms and in series arms thereof disclosed in Patent Document 1 (Japanese Patent No. 2800905 and corresponding Japanese Unexamined Patent Application Publication No. 5-183380) are generally used. FIG. 45 shows the basic configuration of a ladder type filter including one terminal-pair type surface acoustic wave resonators 51 and 52. FIG. 3 shows the configuration of a surface acoustic wave resonator which defines the ladder type filter. FIG. 46 shows the typical characteristics of the ladder type filter.

Ladder type filters have a low loss and a wide band, and provide a large attenuation relatively near the pass-band thereof without difficulty. Thus, sufficient characteristics can be obtained. Ladder type filters have been widely used in portable telephones and suitable devices.

Electrode films having high withstand power properties which define SAW filters have been developed recently, and have been used as filters provided on the transmission side of branching filters. Branching filters, including ladder type SAW filters, which are operated by an AMPS system or by an 800 MHz band CDMA system have been used.

On the other hand, ladder type filters for use in portable telephones, especially for use in branching filters are required to have improved performance. Thus, such devices must have an even lower insertion loss and an even higher attenuation (also see Patent Document 2 which is Japanese Unexamined Patent Application Publication No. 9-167937, Patent Document 3 which is Japanese Patent No. 3191473 and corresponding Japanese Unexamined Patent Application Publication No. 6-260876, and Patent Document 4 which is Japanese Unexamined Patent Application Publication No. 2002-223147).

For example, in a PDC system using an 800 MHz band, filters provided on the transmission sides of the branching filters must have an insertion loss of up to about 1 dB and an attenuation of at least about 40 dB. This system has a transmission band in the range of 940 MHz to 958 MHz and a reception band in the range of 810 MHz to 828 MHz, and thus, the frequency interval between the transmission band and the reception band is 112 MHz. In the case of the above-described AMPS system and 800 MHz band CDMA system, the frequency interval between the transmission band and the reception band is 20 MHz. Accordingly, the frequency interval of the 800 MHz band PDC system is at least five times of that of the above-described AMPS system.

However, the attenuation frequency-range of a ladder type filter is determined by the frequency intervals between the resonant frequencies and the anti-resonant frequencies of resonators (one terminal-pair surface acoustic wave resonators) arranged in the series arm and the parallel arm. Attenuation can be achieved in a frequency band relatively near to the pass band, while attenuation cannot be achieved in a frequency band far from the pass-band.

Moreover, the attenuation is determined by the ratio of the capacitance of the resonator (one terminal-pair type surface acoustic wave resonator) arranged in the parallel arm to that of the resonator arranged in the series arm. Thus, the insertion loss and the attenuation have an inverse relationship to one another.

Therefore, problematically, the requirements that the pass-band and the blocking band are separated from each other by at least 100 MHz, the insertion loss in the pass-band is up to 1 dB and the attenuation in the blocking band is at least 40 dB cannot be satisfied with known ladder type filters.

The above-described problems also occur when ladder type piezoelectric thin-film filters are used, each including an Si substrate having an aperture or a concavity and a vibrating portion in which a pair of opposed upper and lower electrodes sandwich at least one layer of piezoelectric thin film (e.g., made of ZnO or AlN) from the upper and lower surfaces thereof, the piezoelectric thin film being arranged so as to cover the aperture or the concavity.

SUMMARY OF THE INVENTION

To overcome the problems described above, preferred embodiments of the present invention provide a ladder type filter which includes a filter element including at least one series resonator and at least one parallel resonator arranged in a ladder configuration, the at least one series resonator having an inductor connected in parallel thereto, wherein an anti-resonant point on the lower frequency side with respect to the resonant point of the series resonator, caused by the inductor connected in parallel, and the resonant point of the parallel resonator are substantially coincident with each other.

According to the above-described configuration, the inductor is connected in parallel to the at least one series resonator. Thereby, the anti-resonant point of the series resonator is shifted toward the higher frequency side, and thus, the pass-band is widened. Moreover, another anti-resonant point is provided on the lower frequency side with respect to the resonant point of the series resonator.

Thus, the resonant point of the parallel resonator and the anti-resonant point on the lower frequency side with respect to the resonant point of the series resonator, caused by the inductor connected in parallel to the series resonator are substantially coincident with each other. Thereby, the effects of the resonant point of the parallel resonator and the effects of the anti-resonant point provided by the inductor connected in parallel to the series resonator are achieved. Thus, the attenuation is increased with respect to the pass-band, i.e., in the blocking band on the lower frequency side. Especially, when the above-described configuration is included in a filter having a pass-band on the higher frequency side of a branching filter which is used in a communication device such as a portable telephone, a large attenuation is also obtained in a pass-band of the filter having the pass-band on the lower frequency side. Thus, the configuration is effective in the branching filter.

According to another preferred embodiment of the present invention, a ladder type filter includes a filter element including at least one series resonator and at least one parallel resonator arranged in a ladder configuration, the at least one parallel resonator having a first inductor connected in series therewith, the at least one series resonator having a second inductor connected in parallel thereto, wherein the resonant point of the parallel resonator shifted toward the lower frequency side, caused by the first inductor connected in series, and the anti-resonant point developed on the lower frequency side with respect to the resonant point of the series resonator, caused by the second inductor connected in parallel, are substantially coincident with each other.

According to the above-described configuration, the first inductor is connected in series with the at least one parallel resonator. Therefore, the resonant point of the parallel resonator is shifted toward the lower frequency side, such that the pass-band is widened. Moreover, another resonant point is provided on the higher frequency side with respect to the anti-resonant point of the parallel resonator. The attenuation in the blocking band on the higher frequency side with respect to the pass-band is increased by providing an additional resonant point, e.g., in the blocking band on the higher frequency side.

Moreover, according to the above-described configuration, the second inductor is connected in parallel to the at least one series resonator. Thus, the anti-resonant point of the series resonator is shifted toward the higher frequency side, such that the pass-band is widened. Moreover, another anti-resonant point is provided on the lower frequency side with respect to the resonant point of the series resonator.

Thus, the resonant point of the parallel resonator shifted toward the lower frequency side, caused by the first inductor connected in series with the parallel resonator, and the anti-resonant point provided by the second inductor connected in parallel to the series resonator and located on the lower frequency side with respect to the resonant point coincide with each other, e.g., in the blocking band. Thus, the effects of the resonant point shifted toward the lower frequency side and the effects of the anti-resonant point provided by the second inductor connected in parallel to the series resonator are achieved. Thus, the attenuation in the blocking band on the lower frequency side with respect to the pass-band is increased.

According to the above-described configuration, the attenuation in the blocking band on the lower frequency side with respect to the pass-band is increased, and the pass-band width is increased. Especially, when the above-described configuration is included in a filter having a pass-band on the higher frequency side (e.g., a filter on the transmission side) in a branching filter (duplexer), a large attenuation is also obtained in the pass-band on the lower frequency side of a filter (e.g., a filter on the reception side). Thus, the above-described configuration is effective when included in a branching filter.

Preferably, the at least one parallel resonator includes at least two resonators connected in parallel to each other.

Also, preferably, the at least one parallel resonator includes at least two resonators connected in series to each other.

It is preferred that the at least one series resonator includes at least two resonators connected in series to each other.

Also, preferably, the at least one series resonator includes at least two resonators connected in parallel to each other.

According to the above-described configurations, at least two resonators are provided in plural stages. Thus, where the resonator is divided with the combined capacitance of the resonators being kept constant, substantially the same characteristics are exhibited, provided that the capacitances in the range where the inductor is effective are the same. Accordingly, the withstand power property is greatly enhanced, and a ripple in the pass-band is greatly reduced by increasing the number of electrode pairs.

Preferably, the inductor includes at least one of a chip coil and a bonding wire.

Also, preferably, the filter element is mounted in a package, and the inductor includes a wiring provided in the package.

Preferably, the filter element is mounted in a package, and the inductor includes a wiring pattern provided on a mounting substrate on which the package including the filter element is mounted.

Preferably, the series resonator has a capacitance of from about 0.8 pF to about 3 pF. Also, preferably, the parallel resonator has a capacitance of from about 1 pF to about 9.5 pF.

It is preferred that the resonator is a one terminal-pair surface acoustic wave resonator including a plurality of interdigital electrode portions provided on a piezoelectric substrate, and the filter element is a surface acoustic wave element.

It is also preferred that the resonator is a piezoelectric thin-film resonator including a substrate having an aperture or concavity, and a vibrating portion arranged over the aperture or concavity, the vibrating portion includes at least one layer of a piezoelectric thin-film and at least one pair of an upper electrode and a lower electrode, and the piezoelectric thin-film is sandwiched between the upper electrode and the lower electrode such that the upper and lower electrodes are opposed to the upper and lower surfaces of the piezoelectric thin-film, respectively, and the filter element is a piezoelectric thin-film filter element.

The branching filter of a preferred embodiment of the present invention includes the above-described ladder type filter which defines a filter having a pass-band on the higher frequency side.

The communication device according to another preferred embodiment of the present invention includes the ladder type filter or the above-described branching filter mounted thereon.

The ladder type filter according to preferred embodiments of the present invention has superior characteristics, i.e., a small insertion loss in the pass-band and a large attenuation on the lower frequency side with respect to the pass-band. Accordingly, the ladder type filter is suitable for use as a higher frequency side filter of a branching filter of a communication device such as a portable telephone. The ladder type filter is suitable in the communication fields.

The above and other elements, characteristics, features, and advantages of the present invention will become clear from the following description of preferred embodiments taken in conjunction with the accompanying drawings.

DETAILED DESCRIPTION OF PREFERRED EMBODIMENTS

Hereinafter, preferred embodiments of the present invention will be described with reference to FIGS. 1 to 44.

Figure 1:
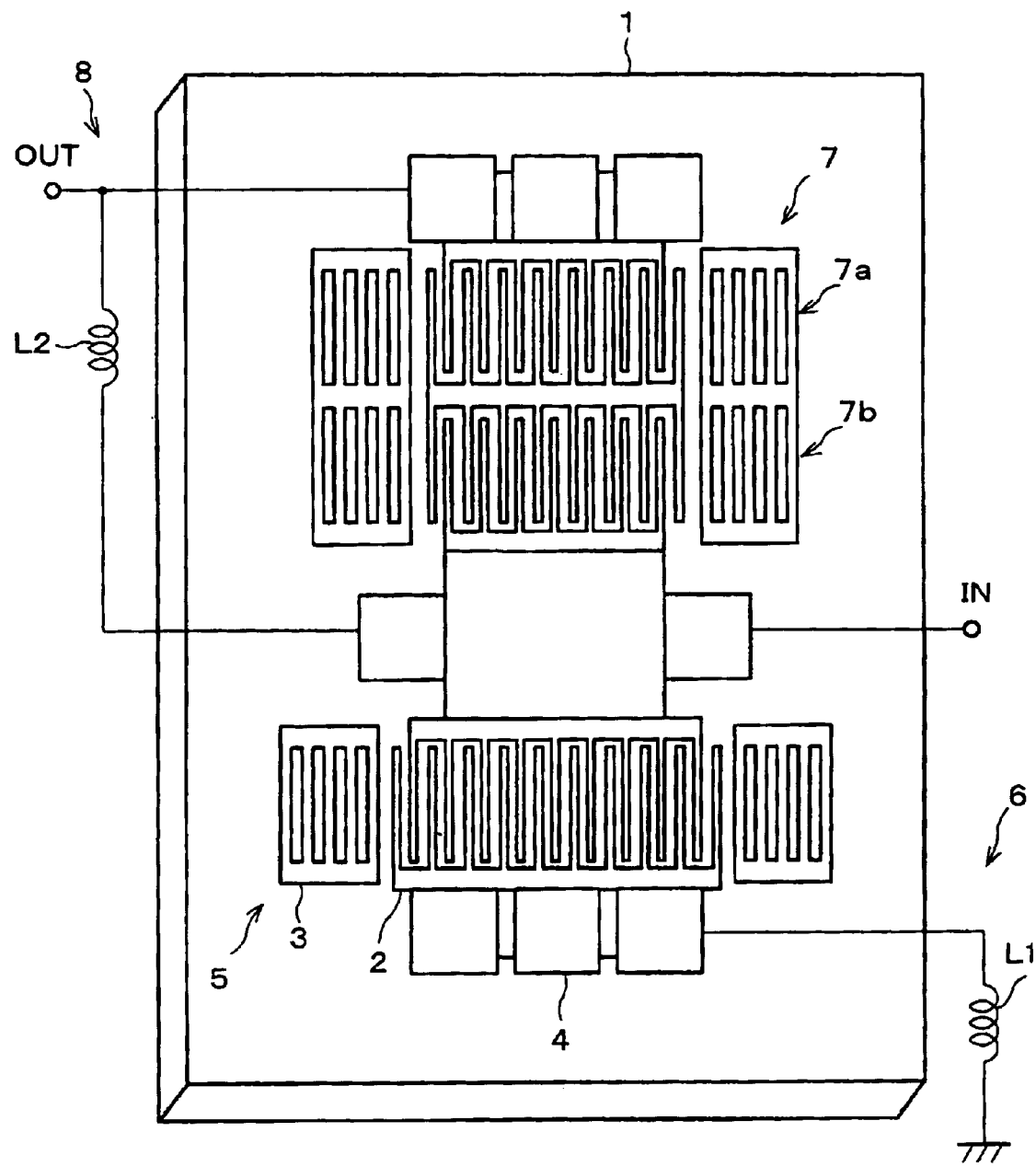
FIG. 1 is a schematic perspective view showing an electrode pattern of a surface acoustic wave filter defining a ladder type filter according to a preferred embodiment of the present invention.
Figure 2:
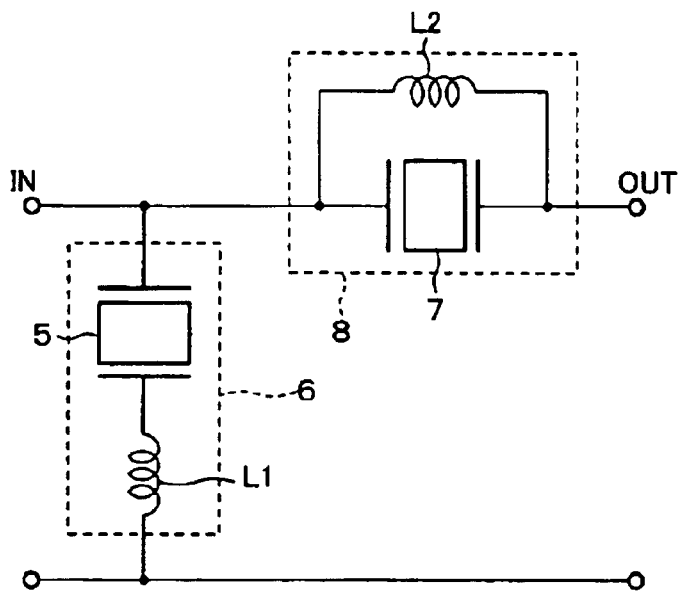
FIG. 2 is a circuit diagram of the surface acoustic wave filter.

As shown in FIGS. 1 and 2, a ladder type surface acoustic wave filter according to a preferred embodiment of the present invention includes a filter element (surface acoustic wave element). The filter element includes first and second basic units 6 and 8 which are combined with each other in a ladder-type arrangement (L-type ladder). The first basic unit 6 includes a first one terminal-pair type surface acoustic wave resonator 5 and a first inductor L1 added to the resonator 5. The basic unit 8 includes a one terminal-pair type surface acoustic wave resonator 7 and a second inductor L2 added to the resonator 7.

Referring to the first basic unit 6, the first one terminal-pair type surface acoustic wave resonator (parallel resonator) 5 having a desired resonant frequency is provided, and the first inductor L1 is connected in series with the resonator 5. This configuration causes the resonant frequency to be substantially in the blocking band which is on the lower frequency side by at least about 100 MHz with respect to the anti-resonant frequency. In the above-described surface acoustic wave filter, the first basic unit 6 is arranged as the parallel arm of the ladder type filter.

Figure 3:
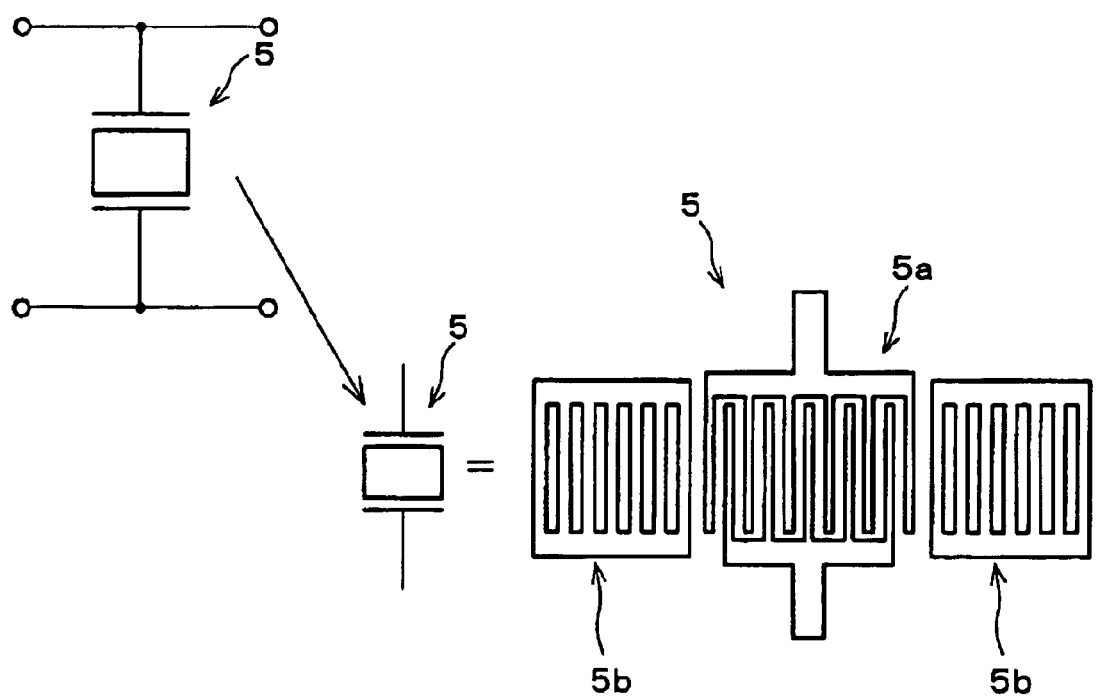
FIG. 3 is a circuit diagram of a first one terminal-pair type surface acoustic wave resonator of the surface acoustic wave filter, and schematically shows the configuration of the resonator.
Figure 4:
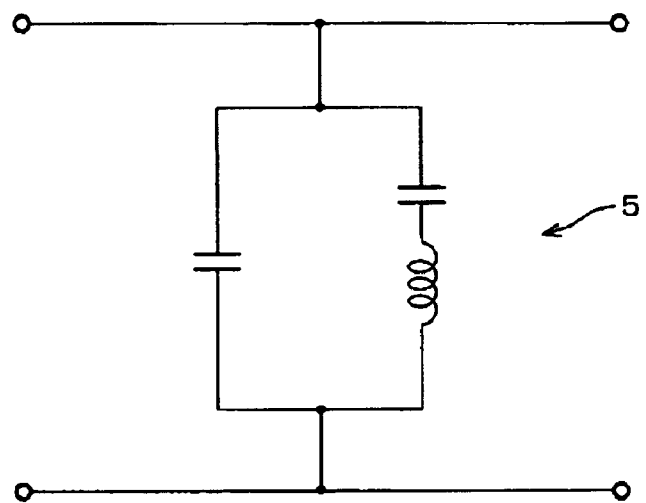
FIG. 4 is an equivalent circuit diagram of the first one terminal-pair type surface acoustic wave resonator.
Figure 5:
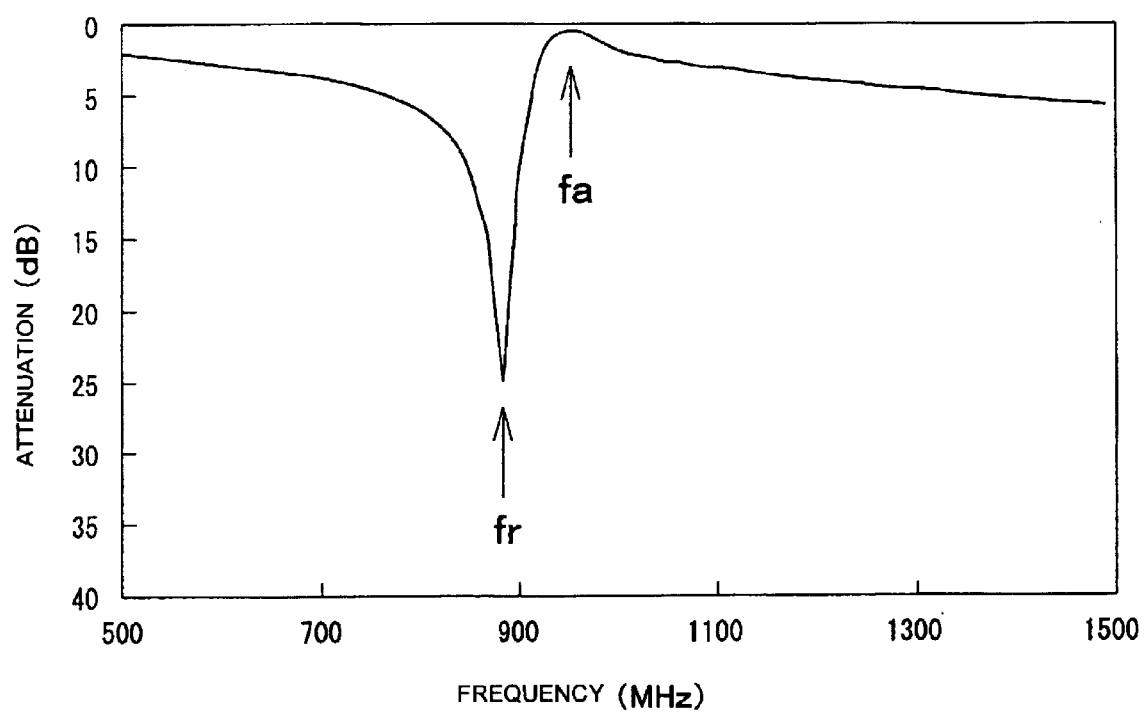
FIG. 5 is a graph showing the attenuation-frequency characteristic of the first one terminal-pair type surface acoustic wave.

FIG. 3 is a circuit diagram in which the first one terminal-pair type surface acoustic wave resonator 5 is arranged in parallel, and also schematically shows the configuration of the resonator 5. FIG. 4 is an equivalent circuit diagram of the first one terminal-pair type surface acoustic wave resonator 5. FIG. 5 shows the attenuation-frequency characteristic of the circuit in which the first one terminal-pair type surface acoustic wave resonator 5 is arranged in parallel.

Referring to the circuit in which the first one terminal-pair type surface acoustic wave resonator 5 is arranged in parallel, the anti-resonant frequency fa is in the pass-band, and the attenuation pole is approximately at the resonant frequency fr. Thus, a large attenuation is generated in the vicinity of the pass-band. However, the attenuation rapidly decreases on the lower frequency side with respect to the resonant frequency fr.

Figure 6:
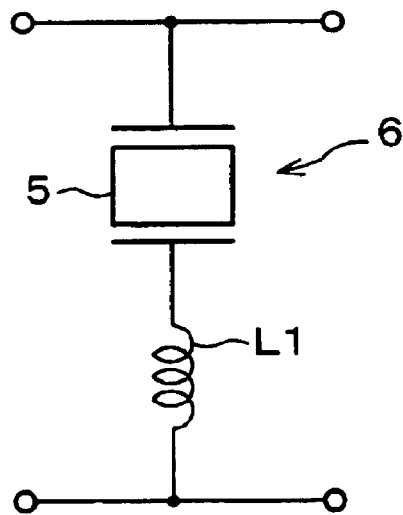
FIG. 6 is a circuit diagram of a first basic unit of the surface acoustic wave filter.
Figure 7:
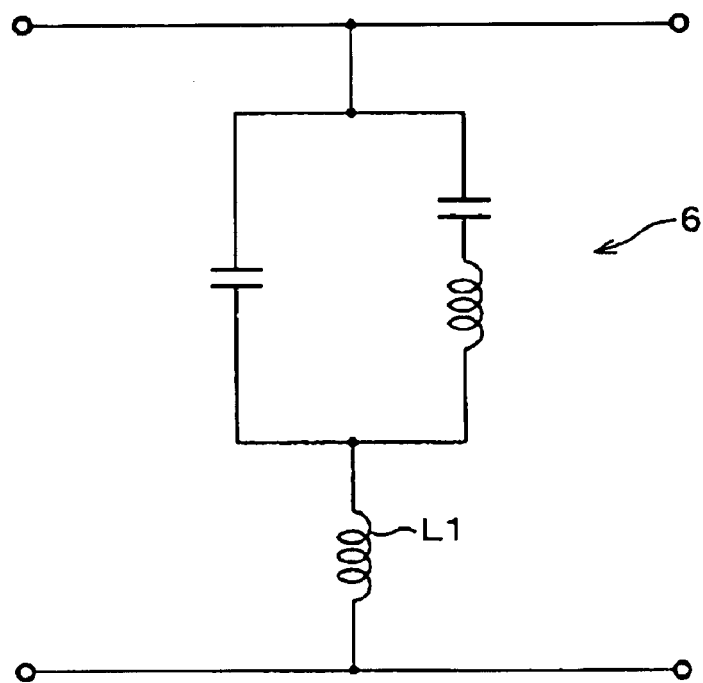
FIG. 7 is an equivalent circuit diagram of the first basic unit.
Figure 8:
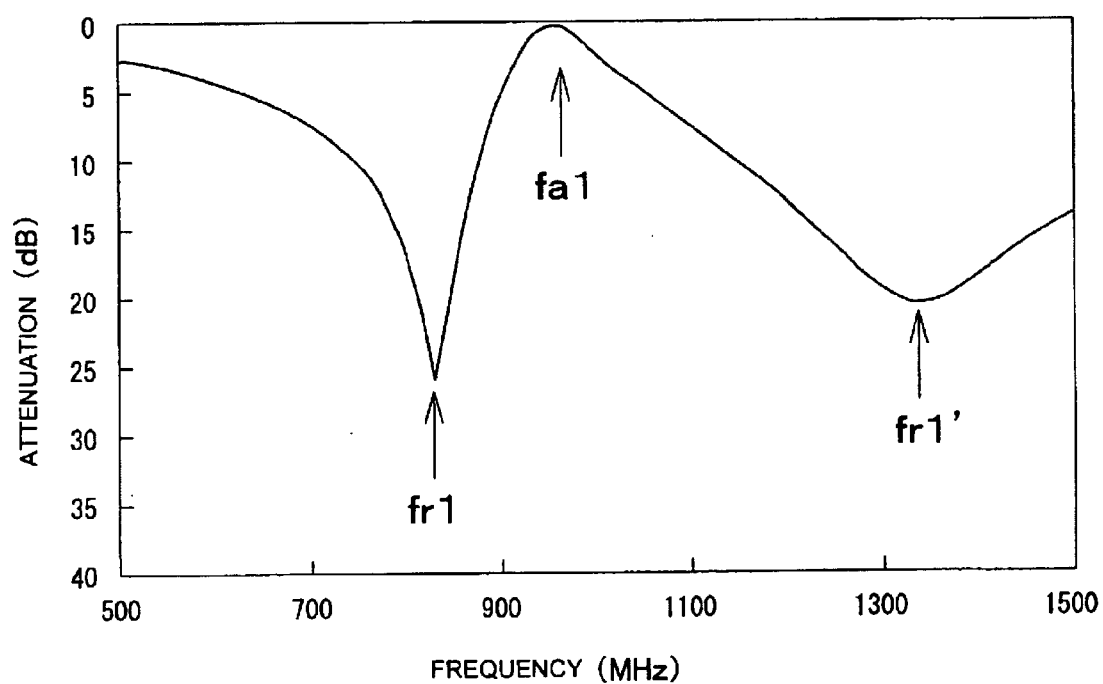
FIG. 8 is a graph showing the attenuation-frequency characteristic of the first basic unit.
Figure 9:
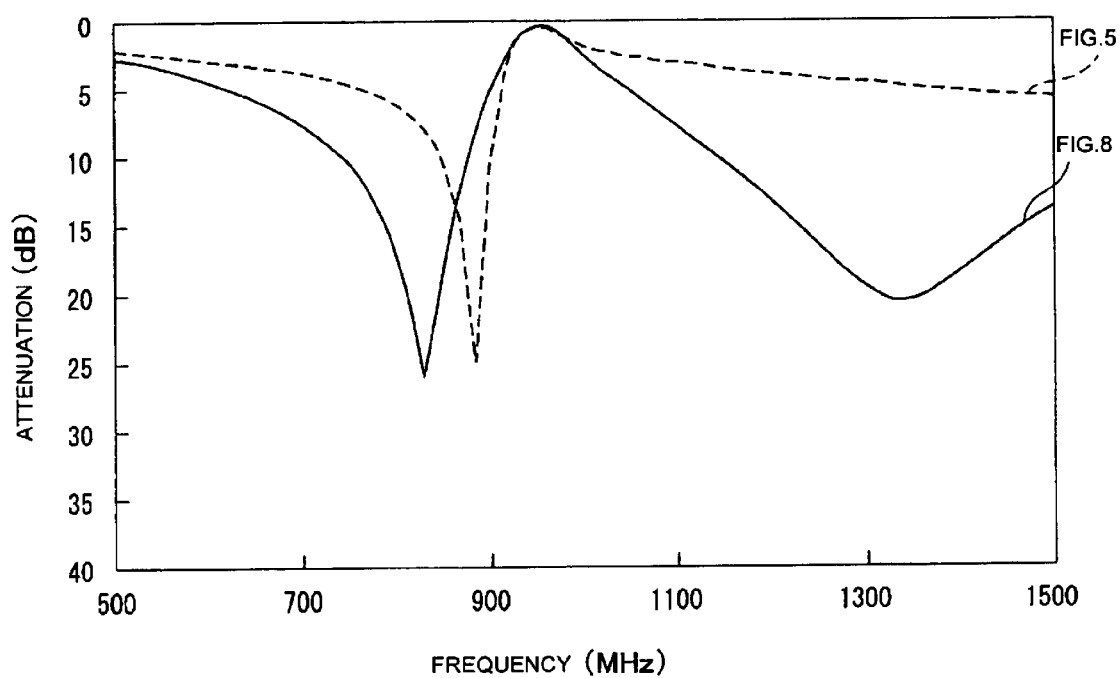
FIG. 9 is a graph in which the curves of FIGS. 5 and 8 are overlapped by each other.

Referring to the first basic unit 6 according to a preferred embodiment of the present invention shown in FIGS. 6 and 7 which is arranged in parallel, the inductor L1 is connected in series with the first one terminal-pair type surface acoustic wave resonator 5, and thereby, the frequency interval between the resonant frequency fr1 and the anti-resonant frequency fa1 is increased. Moreover, a large attenuation is produced in the blocking band which is separated from the pass-band a large amount toward the lower frequency side, as seen in the attenuation-frequency characteristic curves of FIGS. 8 and 9.

Also, a second resonant frequency fr1' is provided on the higher frequency side with respect to the anti-resonant frequency fa1. Thus, an attenuation pole is produced in the blocking band on the higher frequency side of the pass-band. The attenuations caused by the resonant frequency fr1 and the second resonant frequency fr1' are determined by the relationship between the capacitance component of the first one terminal-pair type surface acoustic wave resonator 5 and the external first inductor L1. Thus, the attenuation is easily controlled by changing the number of electrode pairs, the electrode meshing width, and the electrode line width/electrode pitch to adjust the capacitance of the first one terminal-pair type surface acoustic wave resonator 5, or by changing the inductance of the external inductor L1.

Hereinafter, the second basic unit 8 will be described. In the second basic unit 8, the inductor L2 is connected in parallel to the second one terminal-pair type surface acoustic wave resonator (series resonator) 7. The resonator 7 has a desired resonant frequency that is substantially equal to the anti-resonant frequency fa1 of the first one terminal-pair type surface acoustic wave resonator 5 of the first basic unit 6. The second basic unit 8 has an anti-resonant frequency fa2 shifted toward the higher frequency side by the inductor L connected in parallel to the resonator 7. Thereby, the frequency interval between the resonant frequency fr2 and the anti-resonant frequency fa2 is increased. Moreover, an attenuation pole is provided at a frequency substantially in the blocking band which is preferably separated by at least about 100 MHz from the resonant frequency fr2 toward the lower frequency side. According to a preferred embodiment of the present invention, the second basic unit 8 is arranged as the series arm of the ladder type filter.

Figure 10:
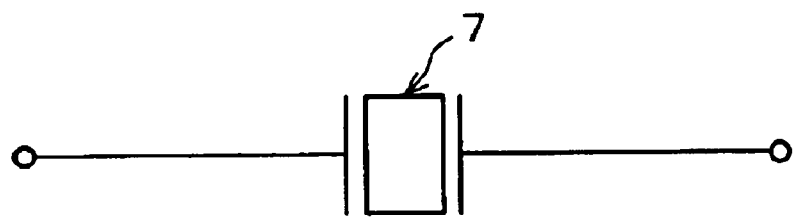
FIG. 10 is a circuit diagram of a second one-terminal pair surface acoustic wave resonator of the surface acoustic wave filter.
Figure 10:
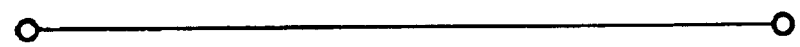
Figure 11:
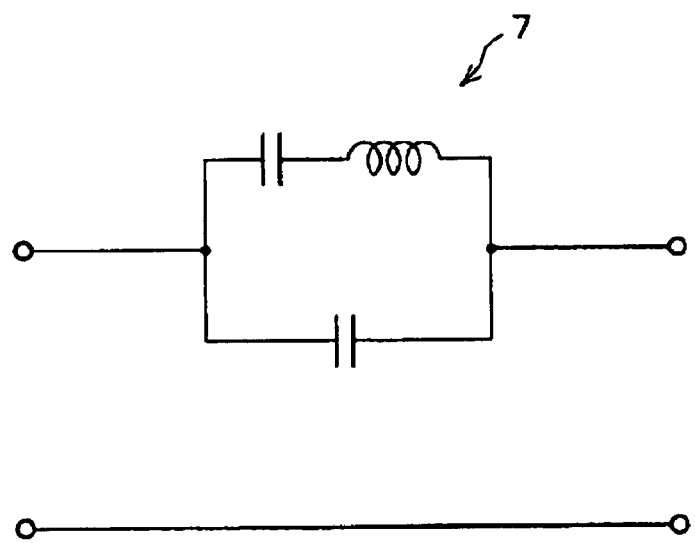
FIG. 11 is an equivalent circuit diagram of the second one terminal-pair surface acoustic wave resonator.
Figure 12:
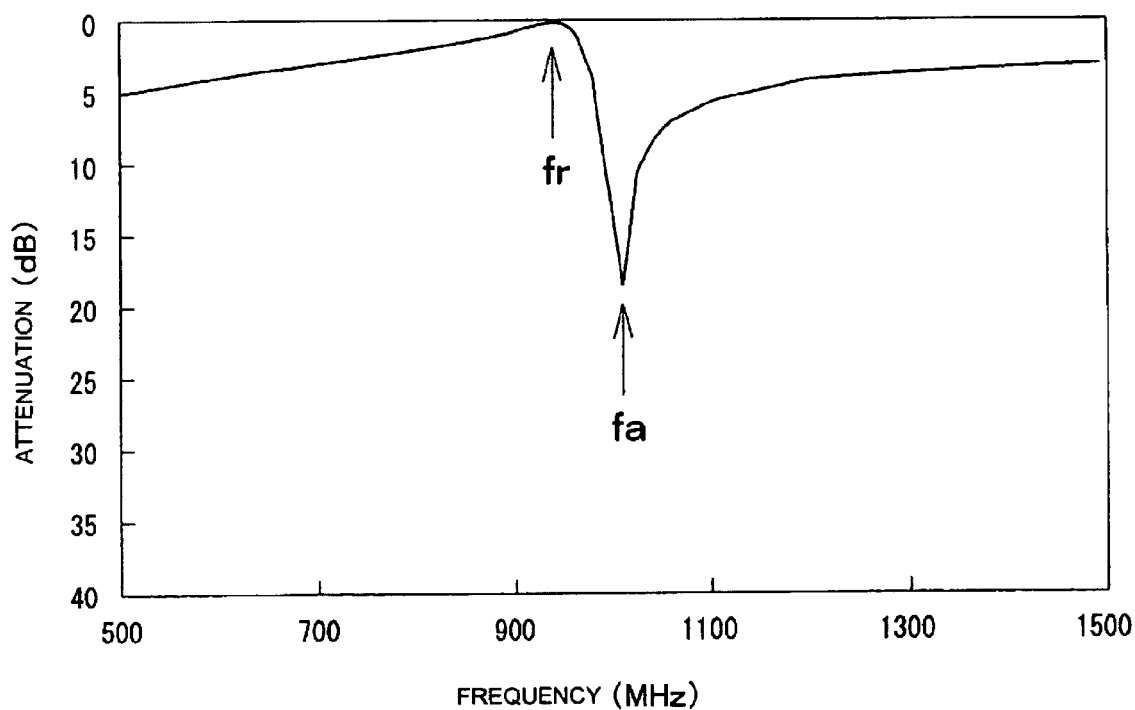
FIG. 12 is a graph sowing the attenuation-frequency characteristic of the second one terminal-pair surface acoustic wave resonator.

FIG. 10 is a circuit diagram in which the second one terminal-pair type surface acoustic wave resonator 7 is arranged in series. FIG. 11 is an equivalent circuit diagram of the second one terminal-pair type surface acoustic wave resonator 7. FIG. 12 shows the attenuation-frequency characteristic of the circuit in which the second one terminal-pair type surface acoustic wave resonator 7 is arranged in series.

In the case of the second one terminal-pair type surface acoustic wave resonator 7 with the inductor L2 being omitted, the resonant frequency fr is in the pass-band, and thus, the attenuation pole by the anti-resonant frequency fa is near the resonant frequency fr on the higher frequency side thereof. However, since the attenuation pole by the anti-resonant frequency fa is generated on the higher frequency side with respect to the resonant frequency fr, i.e., on the higher frequency side of the pass-band, an attenuation is not obtained in the blocking band which is on the lower frequency side of the pass-band.

Figure 13:
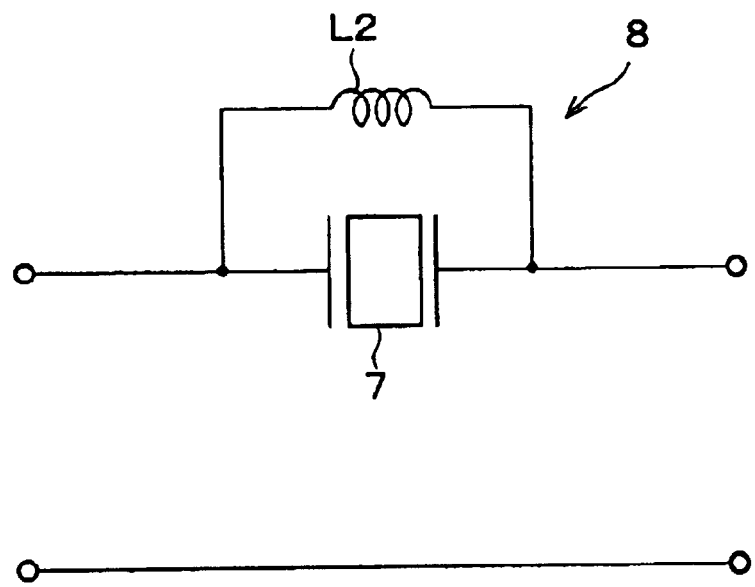
FIG. 13 is a circuit diagram of a second basic unit of the surface acoustic wave filter.
Figure 14:
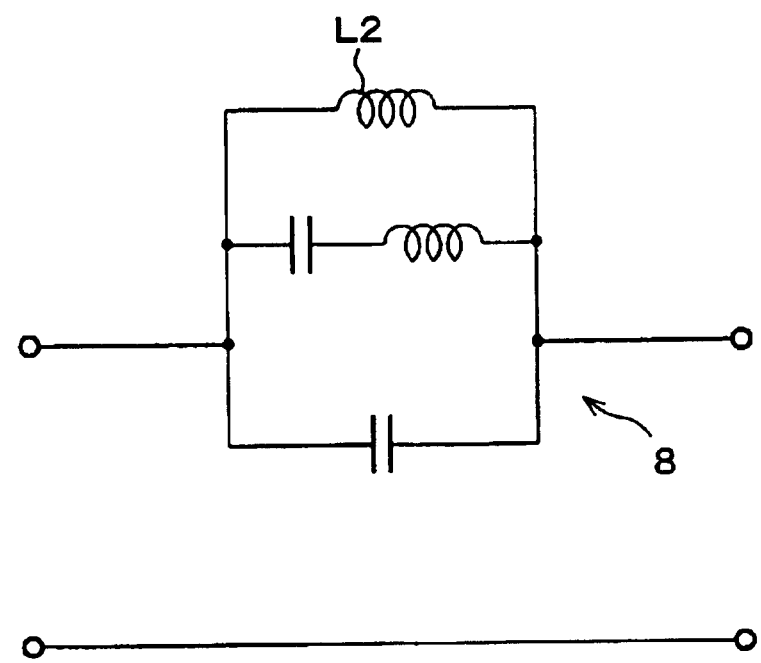
FIG. 14 is an equivalent circuit diagram of the second basic unit.
Figure 15:
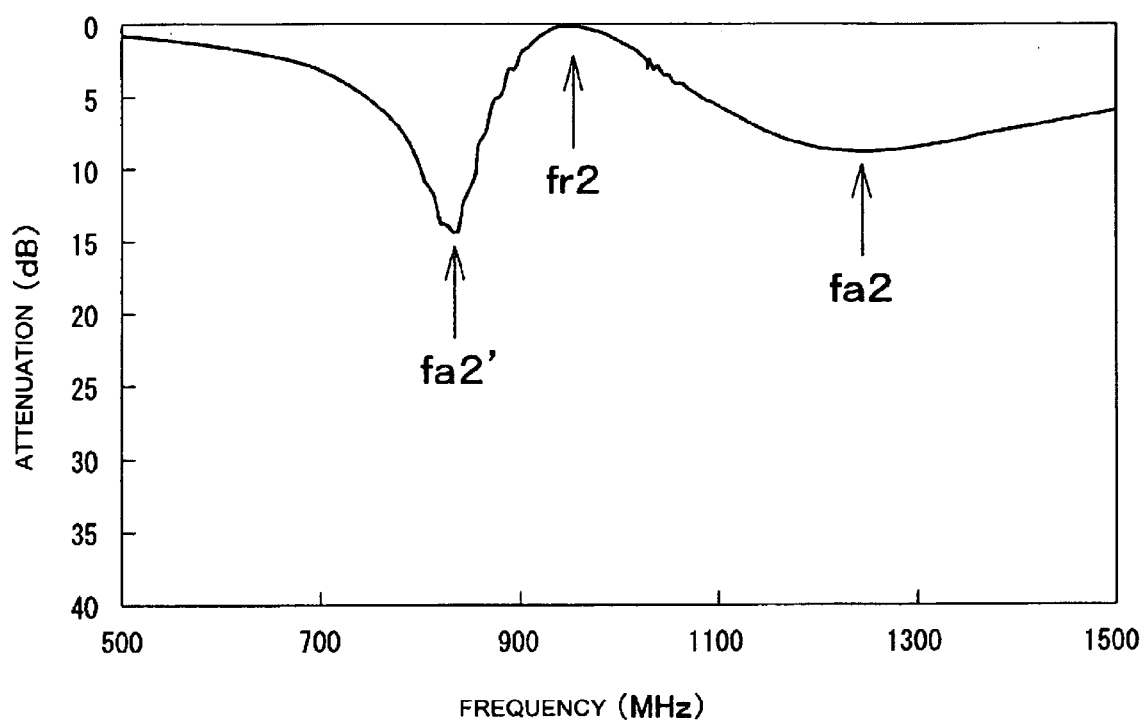
FIG. 15 is a graph showing the attenuation-frequency characteristic of the second basic unit.
Figure 16:
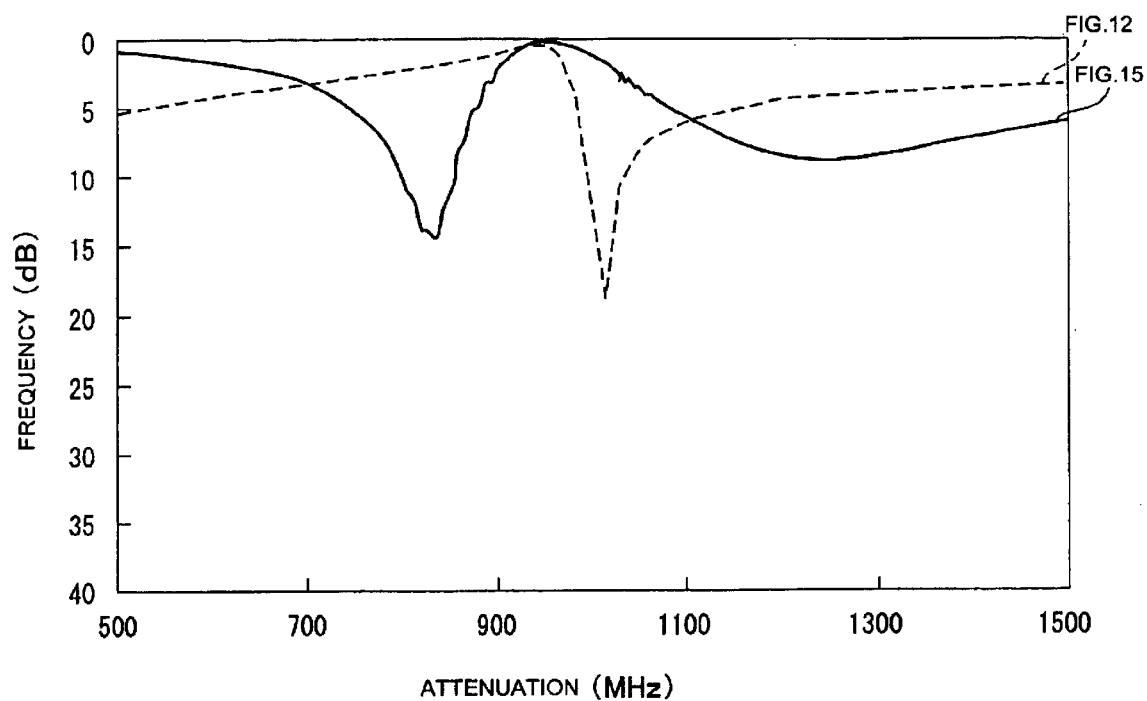
FIG. 16 is a graph in which the curves of FIGS. 12 and 15 are overlapped by each other.

On the other hand, in the second basic unit 8 according to a preferred embodiment of the present invention shown in FIGS. 13 and 14, the inductor L2 is connected in parallel to the second one terminal-pair type surface acoustic wave resonator 7. Therefore, as seen in the attenuation-frequency characteristic curve of FIGS. 15 and 16, the pass-band width is increased, which is caused by the anti-resonant frequency fa2 being shifted toward the higher frequency side, and simultaneously, a second anti-resonant frequency fa2' is provided on the lower frequency side of the pass-band, and thereby, an attenuation is also obtained in the blocking band separated by a large amount from the pass-band toward the lower frequency side, due to the second anti-resonant frequency fa2'.

The second anti-resonant frequency fa2' is determined by the relationship between the capacitance component of the second one terminal-pair type surface acoustic wave resonator 7 and the external inductor L2. Thus, the second anti-resonant frequency fa2' is easily controlled by changing the number of electrode pairs, the meshing width, and the electrode line-width/electrode pitch to adjust the capacitance of the second one terminal-pair type surface acoustic wave resonator 7 or by adjusting the inductance of the external inductor L2.

The second basic unit 8 defines the series arm of the ladder type filter. Thus, both of the series arm and the parallel arm produce attenuation poles on the lower frequency side with respect to the pass-band, that is, on the lower frequency side of the resonant frequency fr2. Accordingly, a large attenuation is provided on the lower frequency side using fewer components than those of a known ladder type filter. Moreover, since the number of components is reduced, the attenuation in the blocking band is increased while the insertion loss is reduced.

Moreover, regarding the attenuation poles on the lower frequency side of the pass-band, produced by the first and second basic units 6 and 8, the frequencies and the attenuation at the poles are independently adjusted for each of the first and second basic units 6 and 8. Thus, attenuation is easily obtained in a frequency band which is separated by at least about 100 MHz toward the lower frequency side. According to this configuration, for a frequency system in which the transmission band and the reception band are separated from each other by a large amount, a surface acoustic wave filter having a very low insertion loss in the pass-band and a high attenuation in the blocking band is provided using the smallest number of components possible.

EXAMPLE

Hereinafter, an example of a surface acoustic wave filter according to a preferred embodiment of the present invention will be described. FIG. 1 shows an 800 MHz band PDC filter with a central frequency of 949 MHz. FIG. 2 shows a circuit configuration. The surface acoustic wave filter includes a piezoelectric substrate 1, e.g., preferably made of a 41° Y-cut X-propagation LiNbO$_3$ substrate, interdigital electrodes 2 for propagating a surface acoustic wave, reflector electrodes 3, and wire-bonding pads 4 to be electrically connected to electrode terminals of a package by wire-bonding, which are provided on the piezoelectric substrate 1. The interdigital electrodes 2, the reflector electrodes 3, and the wire-bonding pads 4 are provided on a metallic electrode film, e.g., by a photolithographic method. A plurality of interdigital electrodes 2 are provided on the piezoelectric substrate 1 in the surface acoustic wave propagation direction. Thereby, the first and second one terminal-pair type surface acoustic wave resonators 5 and 7 are provided.

In this example, to improve the withstand power property, a lamination structure is used, in which a metallic electrode film made of an Al-1 percent by weight Cu (Al alloy) having a thickness of about 171 nm is provided on a Ti electrode film having a thickness of about 10 nm. An Al simple substance may be used instead of the Al alloy. Ti, Al, and Cu represent titanium, aluminum, and copper, respectively.

Referring to FIG. 2, the first basic unit 6 includes the first one terminal-pair type surface acoustic wave resonator (parallel resonator) 5, and the inductor L1 connected in series with the resonator 5. The second basic unit 8 includes the second one terminal-pair type surface acoustic wave resonator (series resonator) 7 and the second inductor L2 connected in parallel to the resonator 7.

In this example, as the piezoelectric substrate 1, the 41° Y-cut X-propagation LiNbO$_3$ substrate is preferably used. However, this piezoelectric substrate 1 is not restricted to the 41° Y-cut X-propagation LiNbO$_3$ substrate. LiNbO$_3$ substrates with different cut angles and LiTaO$_3$ substrates, such as a 64° Y-cut X-propagation LiNbO$_3$ substrate, a 128° Y-cut X-propagation LiNbO$_3$ substrate, and 38.5 to 55° Y-cut X-propagation LiTaO$_3$ substrates, and other suitable substrates may be used provided the relationship between the frequencies in transmission and reception bands and the relationship between the insertion loss and the attenuation are considered.

In this example, the first one terminal-pair type surface acoustic wave resonator 5 of the first basic unit 6 has a one-stage configuration. On the other hand, in the second basic unit 8 in which a surface acoustic wave is excited in the pass-band, the one terminal-pair type surface acoustic wave resonator 7 has a two-stage configuration to improve the withstand power property which is caused by the power-distribution.

As described above, the second one terminal-pair type surface acoustic wave resonator 7, and the first one terminal-pair type surface acoustic wave resonator 5 may include at least one one terminal-pair surface acoustic wave resonator, respectively. The surface acoustic wave element includes the piezoelectric substrate 1, and the first and second one terminal-pair type surface acoustic wave resonators 5 and 7 provided on the piezoelectric substrate 1.

Figure 17:
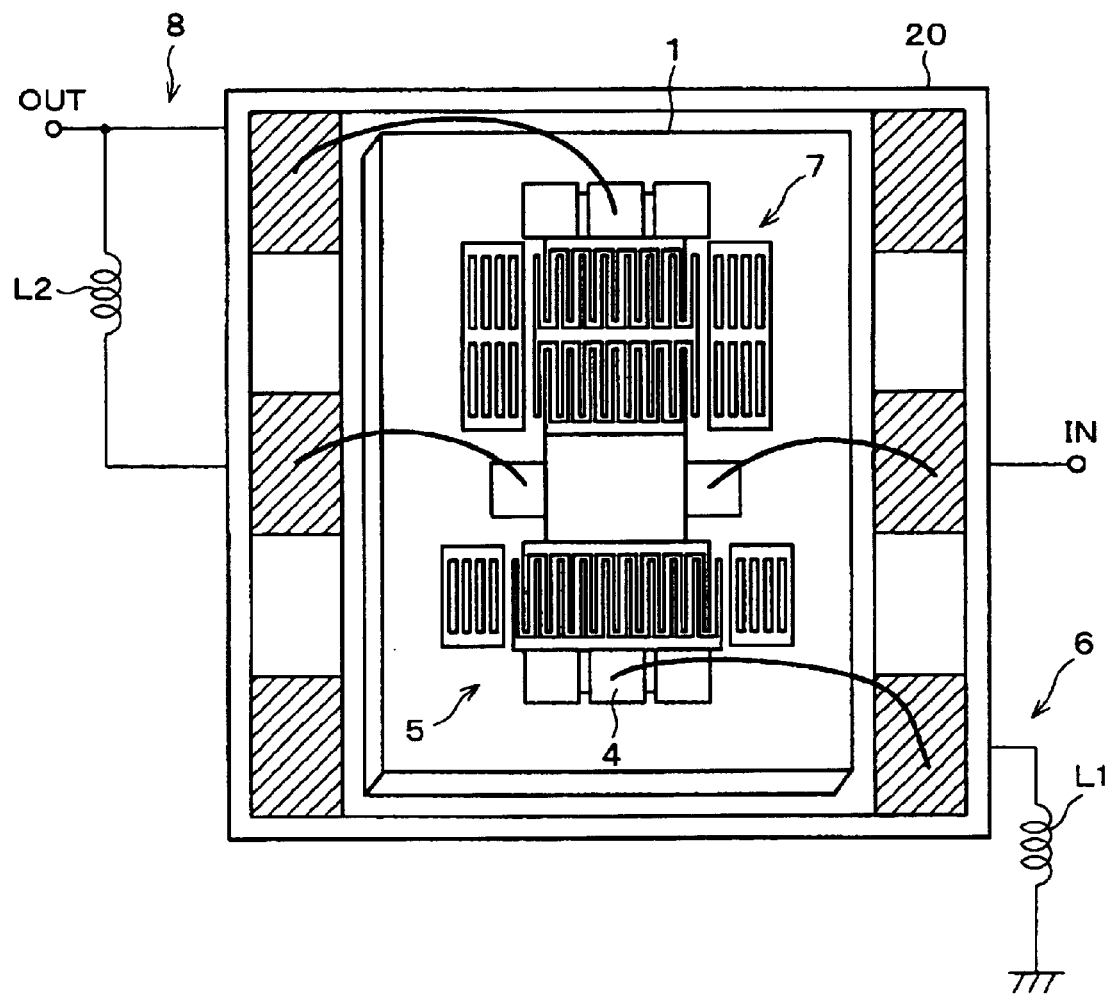
FIG. 17 schematically shows the configuration of the surface acoustic wave filter and that of a package having the surface acoustic wave filter mounted therein.

The above-described surface acoustic wave element is accommodated in a ceramic package 20 as shown in FIG. 17. The package 20 is mounted on a mounting substrate, and also, chip-type inductors L1 and L2 defining the first basic unit 6 and the second basic unit 8, respectively, are mounted on the mounting substrate. In this example, the inductors L1 and L2 are preferably formed as chip components.

However, the inductor L1 defining the first basic unit 6 may have a small inductance. Thus, the first inductor L1 may be defined by an electrode wiring on the piezoelectric substrate 1, may be defined by an electrode wire in the package 20, or may be defined by a wiring pattern on the mounting substrate on which the package 20 is mounted.

On the other hand, the second inductor L2 must have a relatively large inductance. Thus, preferably, the second inductor L2 is an inductor which is intentionally added, and, preferably, is defined by a coil as a chip component. The design parameters used in this example are shown in Table 1.

TABLE 1

| Unit | Meshing width | Number of Interdigital electrode pairs | Number of reflectors | Inductor |
| --- | --- | --- | --- | --- |
| First basic unit | 62.5 µm | 160 pairs | 10 | 2.7 nH |
| Second basic unit | 50 µm | 112 pairs | 10 | 12 nH |
|  | 50 µm | 112 pairs | 10 |  |

Figure 18:
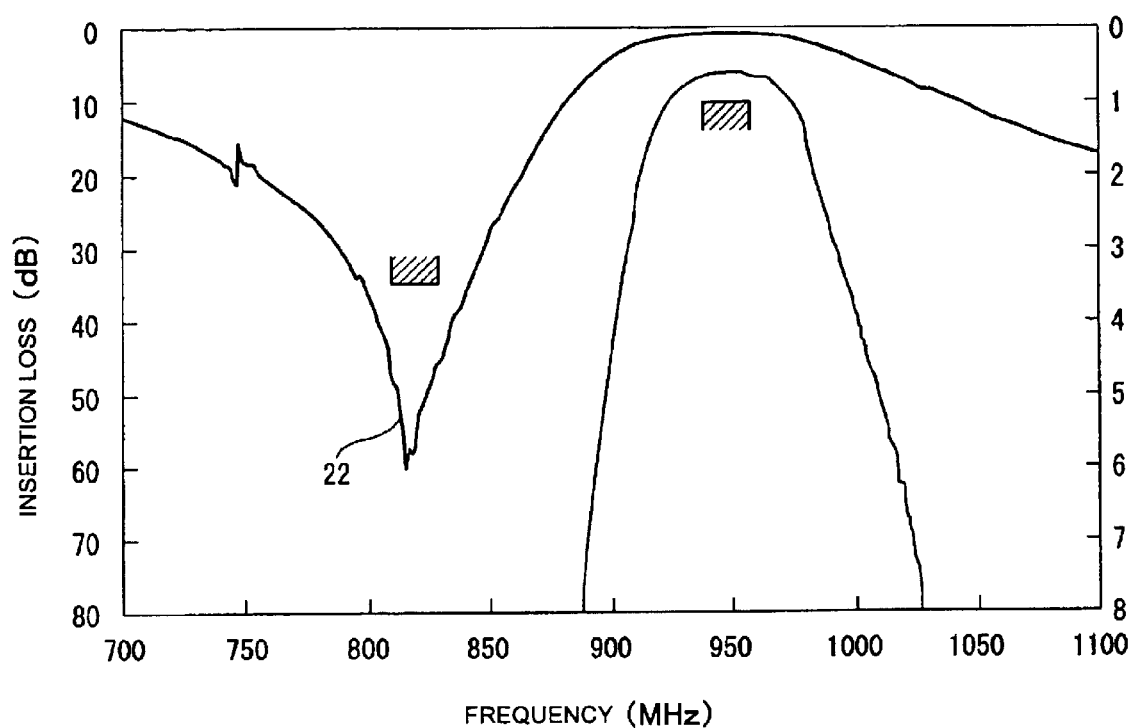
FIG. 18 is a graph showing the electrical characteristic of the surface acoustic wave filter.

FIG. 18 shows the characteristics of the surface acoustic wave filter produced in this example. The surface acoustic wave filter was used as a transmission-side filter of an 800 MHz band PDC system, for example. In this case, referring to the experimental values in the frequency band of the transmission-side filter, the following attenuation characteristics were obtained: the insertion loss in the pass-band of 940 MHz to 958 MHz was about 0.66 dB, and the attenuation characteristic (see an attenuation peak 22) in a desired blocking band of 810 MHz to 828 MHz was about 45.9 dB. The above-mentioned blocking band corresponds to the pass-band of the reception-side filter in the 800 MHz PDC system.

As seen in this example, the attenuation pole for the resonant frequency fr1 in the first basic unit 6 can be considerably shifted toward the lower frequency side, separated by a large amount from the pass-band.

Referring to the second basic unit 8, the second inductor L2 is connected in parallel to the second one terminal-pair type surface acoustic wave resonator 7, and thereby, the anti-resonant frequency fa2 in the second basic unit 8 is shifted toward the higher frequency side. Thus, the passband width is increased. Moreover, an attenuation pole at the anti-resonant frequency fa2' is provided on the lower frequency side with respect to the pass-band. Originally (the inductor L2 is omitted), the attenuation pole is not generated by the second one terminal-pair type surface acoustic wave resonator 7 arranged in the series arm.

The attenuation pole at the anti-resonant frequency fa2' caused by the second basic unit 8 is controlled to be in the blocking band by adjustment of the inductor L2, as well as in the first basic unit 6.

According to this example, the attenuation pole provided by the first basic unit 6 and the attenuation pole at the anti-resonant frequency fa2' provided by the second basic unit 8 substantial coincide with each other in the blocking band. Thereby, an increased attenuation is ensured on the lower frequency side of the pass-band.

Thereby, in this example, an attenuation is greatly increased outside the pass-band (e.g., in the blocking band on the lower frequency side with respect to the pass-band, i.e., outside the pass-band) by using the smallest number of components possible, that is, by using one parallel arm of the first basic unit 6 and one series arm of the second basic unit 8, while the insertion loss is greatly suppressed so as to be very small.

Thus, the surface acoustic wave filter of preferred embodiments of the present invention ensures a large attenuation on the lower frequency side of the pass-band. Accordingly, the surface acoustic wave filter is suitable for use as the transmission-side filter of a branching filter in a communication device, such as a portable telephone, and is especially suitable for use as the transmission-side filter of a branching filter in an 800 MHz band PDC system communication device of which the pass-band on the reception side is set to be on the significantly lower frequency side with respect to the pass-band on the transmission side, i.e., to be in the range of 100 MHz to 200 MHz.

Figure 19:
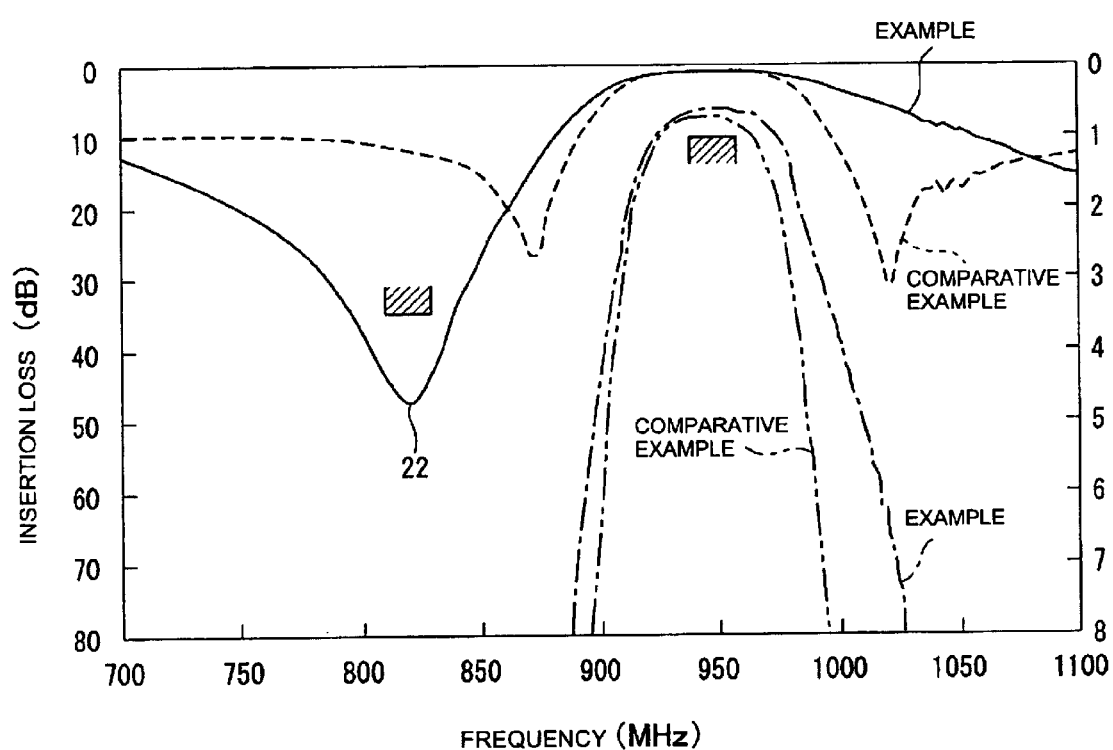
FIG. 19 is a graph showing the electrical characteristics of the surface acoustic wave filters according a preferred embodiment of the present invention and a comparative example.

Hereinafter, the characteristics of the surface acoustic wave filter of this example and the respective comparative examples will be described. First, as a comparative example, the same surface acoustic wave filter as the surface acoustic wave filter of this example except that the inductors L1 and L2 were excluded was produced. FIG. 19 shows both of the insertion loss-frequency characteristics of the present preferred embodiment and the comparative example. As seen in FIG. 19, the pass-band of this preferred embodiment is wider and the insertion loss thereof is less than the comparative example. Moreover, the attenuation on the lower frequency side of the pass-band, i.e., outside the pass-band (in particular, on the lower frequency side by at least 100 MHz) is much less than that of the comparative example.

Figure 20:
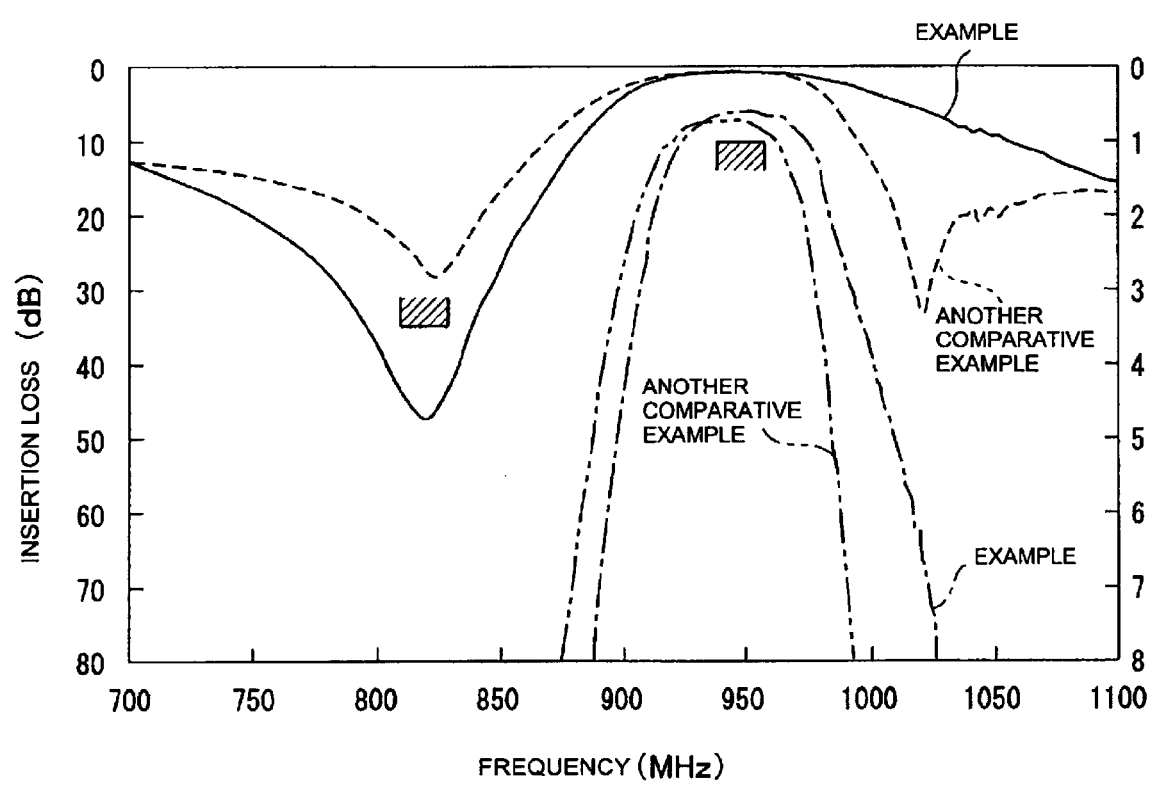
FIG. 20 is a graph showing both of the electrical characteristics of the surface acoustic wave filter and another comparative example.

Moreover, as another comparative example, the same surface acoustic wave filter as that of this example except that the inductor L2 was excluded was produced. FIG. 20 shows both of the insertion loss-frequency characteristics of the SAW filters of this example and the other comparative example. As seen in FIG. 20, the pass-band of the SAW filter of this example is wider and the insertion loss thereof is less than those of the other comparative example. Moreover, the attenuation on the lower frequency side of the pass-band, i.e., outside the pass-band (in particular, on the lower frequency side by at least 100 MHz) is much less than that of the other comparative example.

Figure 21:
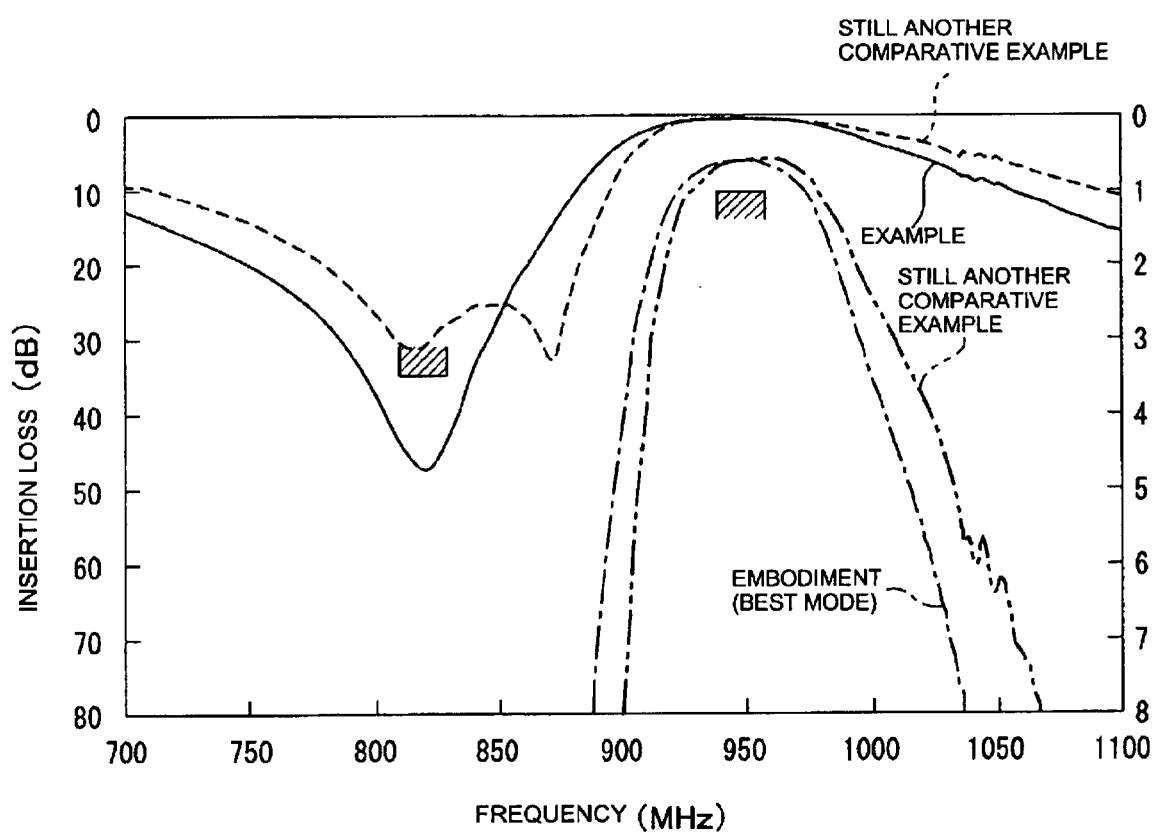
FIG. 21 is a graph showing both of the electrical characteristics of the surface acoustic wave filter and still another comparative example.
Figure 22:
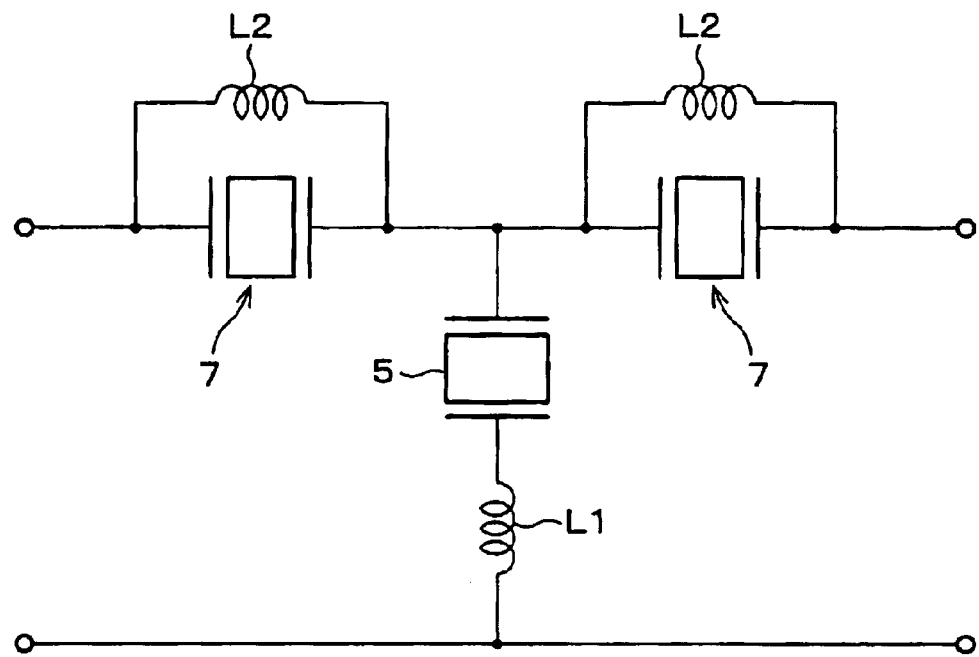
FIG. 22 is a circuit diagram of a modification of the surface acoustic wave filter.
Figure 23:
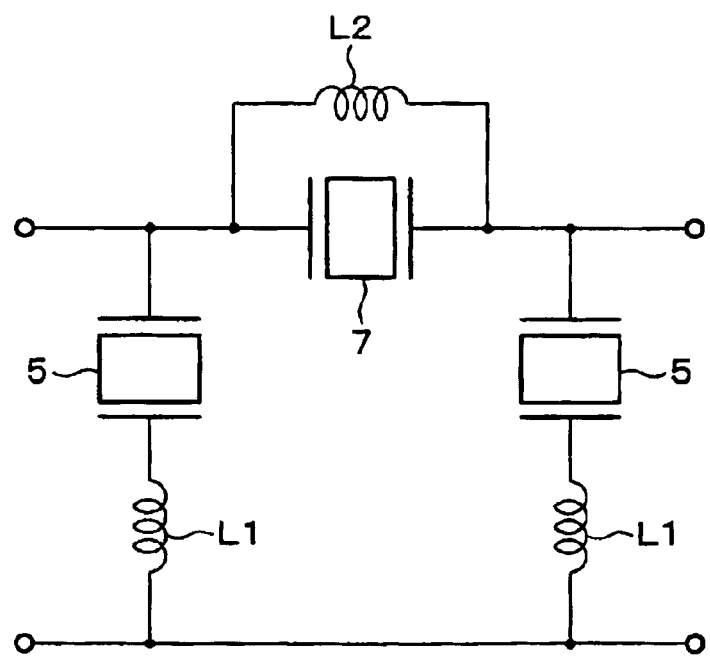
FIG. 23 is a circuit diagram of another modification of the surface acoustic wave filter.
Figure 24A:
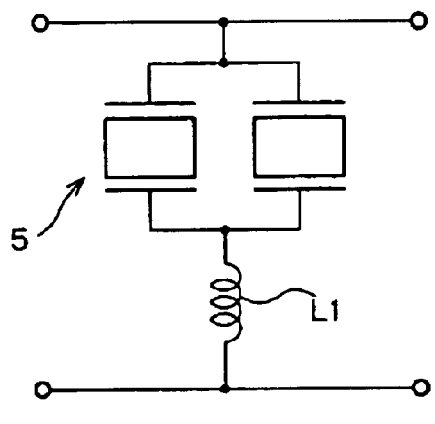
FIGS. 24A, 24B, 24C, and 24D are circuit diagrams of other modifications of the surface acoustic wave filter, respectively.
Figure 24B:
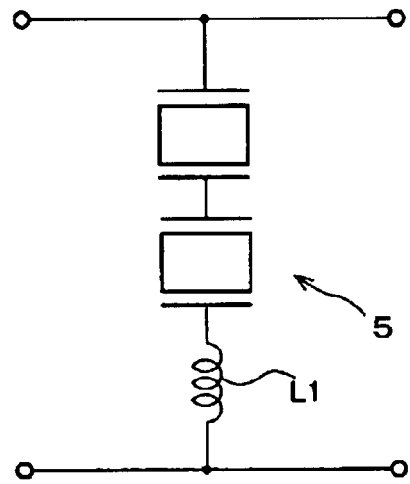
Figure 24C:
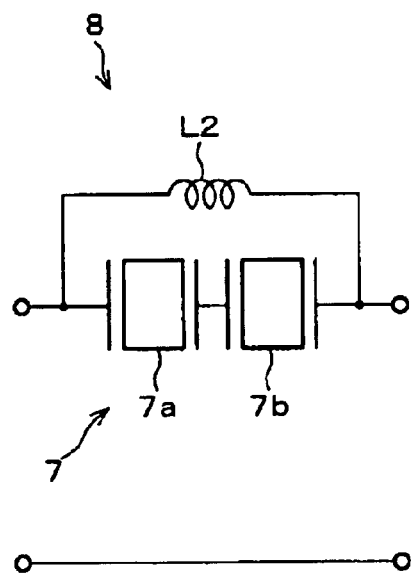
Figure 24D:
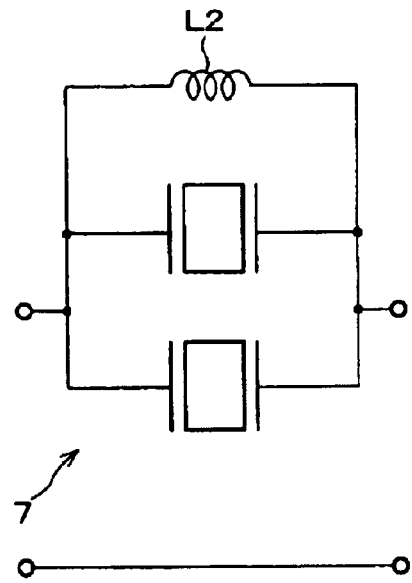

Moreover, for still another comparative example, the same surface acoustic wave filter as that of this example except that the inductor L1 is excluded is produced. FIG. 21 shows both of the insertion loss-frequency characteristics of the SAW filter of this example and the still another comparative example. As seen in FIG. 21, the insertion loss in the pass band of this example is less than that of the still another comparative example. Moreover, the attenuation on the lower frequency side of the pass-band, i.e., outside the pass-band (in particular, on the lower frequency side by at least 100 MHz) is much less than that of the still another comparative example.

In this preferred embodiment, the L-ladder type filter is described. The ladder-type of preferred embodiments of the present invention may be another ladder type filter, e.g., a T-ladder type filter shown in FIG. 22 and a π-ladder type filter shown in 23. That is, the ladder type filter of the present invention may have any suitable ladder configuration, provided that an inductor is connected in parallel to at least one series resonator.

Moreover, the ladder type filter of the present invention may have a configuration in which the first and second one terminal-pair type surface acoustic wave resonators 5 and 7 are divided into a plurality of stages (the resonators are connected in series or in parallel), as shown in FIGS. 24A to 24D. According to the above-mentioned plural-stage configurations, the number of electrode pairs can be increased, which reduces the generation of ripples, and also, improves the withstand power property.

Hereinafter, differences between the ladder type filters of preferred embodiments of the present invention and those according to known techniques (Patent Documents 2 to 4) will be described in detail. It should be noted that for easy comparison, the filter used for formation of the characteristic graph in the Patent Document 4 includes the same substrate as that of the ladder type filter of preferred embodiments of the present invention.

Figure 25:
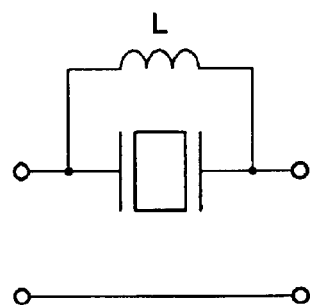
FIG. 25 is a circuit block diagram showing an example in which an inductor is connected in parallel to a series resonator.
Figure 26:
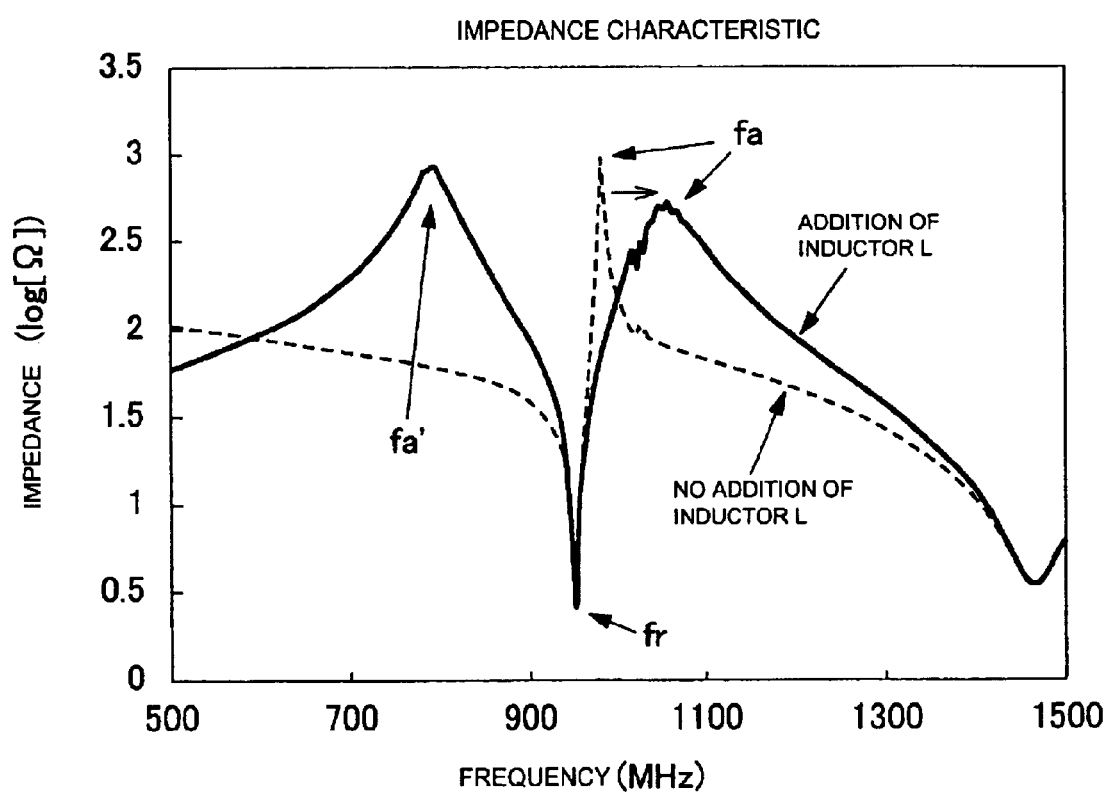
FIG. 26 is a graph showing the impedance characteristic of the circuit shown in FIG. 25.

According to preferred embodiments of the present invention, the inductor L (12 nH) is connected in parallel to the series resonator, as shown in FIG. 25, such that the capacitance and the inductance of the resonator are adjusted, and thus, an anti-resonance point (fa') on the lower frequency side of the pass-band coincides with the resonance point of the parallel resonator, as shown in FIG. 26. Thereby, the attenuation on the lower frequency side is greatly improved.

In the above-described Patent Document 2 (Japanese Unexamined Patent Application Publication No. 9-167937), three series resonators are provided and an inductor is connected in parallel to one of the series resonators as shown in FIG. 1 of the Specification of the Patent Document 2. According to this configuration, the inductor connected in parallel causes the anti-resonance point of the series resonator having the inductor connected in parallel thereto to be shifted toward the higher frequency side. Thus, the anti-resonance points of the remaining series resonators define an attenuation pole on the higher frequency side of the pass-band. Moreover, the attenuation on the higher frequency side and outside the pass-band is improved by the anti-resonance point of the series resonator having the inductor connected in parallel thereto, the anti-resonance point of the series resonator being shifted toward the higher frequency side as described above.

However, according to the above-described configuration, an anti-resonance point on the lower frequency side of the pass-band, which is caused by the inductor connected in parallel to the series resonator, is not taken into account at all. Thus, the attenuation on the lower frequency side with respect to the pass-band cannot be increased.

Moreover, as illustrated in FIG. 17 of the Patent Specification of Patent Document 3 (Japanese Patent No. 3191473), an inductor is connected in parallel to the series-connected resonators. According to this configuration, the anti-resonance points of the series resonators are shifted toward the higher frequency side. Thereby, the pass-band width is increased.

However, the anti-resonance points on the lower frequency side of the pass-band, which is caused by the inductor connected in parallel to the series resonators, are not taken into account at all. Thus, the attenuation on the lower frequency side of the pass-band cannot be increased.

Moreover, as illustrated in FIG. 1 of Patent Document 4 (Japanese Unexamined Patent Application Publication No. 2002-223147), an inductor and a capacitor are connected in parallel to a series resonator. The frequency at the anti-resonance point of the series resonator is adjusted by the above-mentioned configuration.

Figure 27:
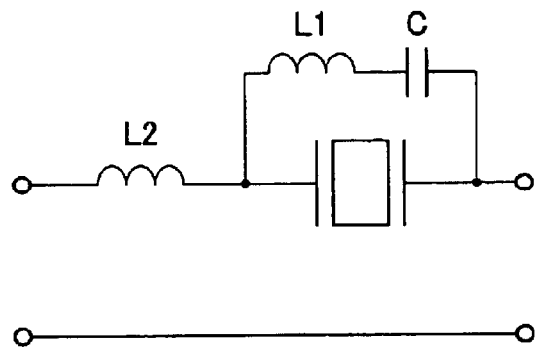
FIG. 27 is a circuit block diagram showing the essential configuration of an embodiment described in Patent Document 4.
Figure 28:
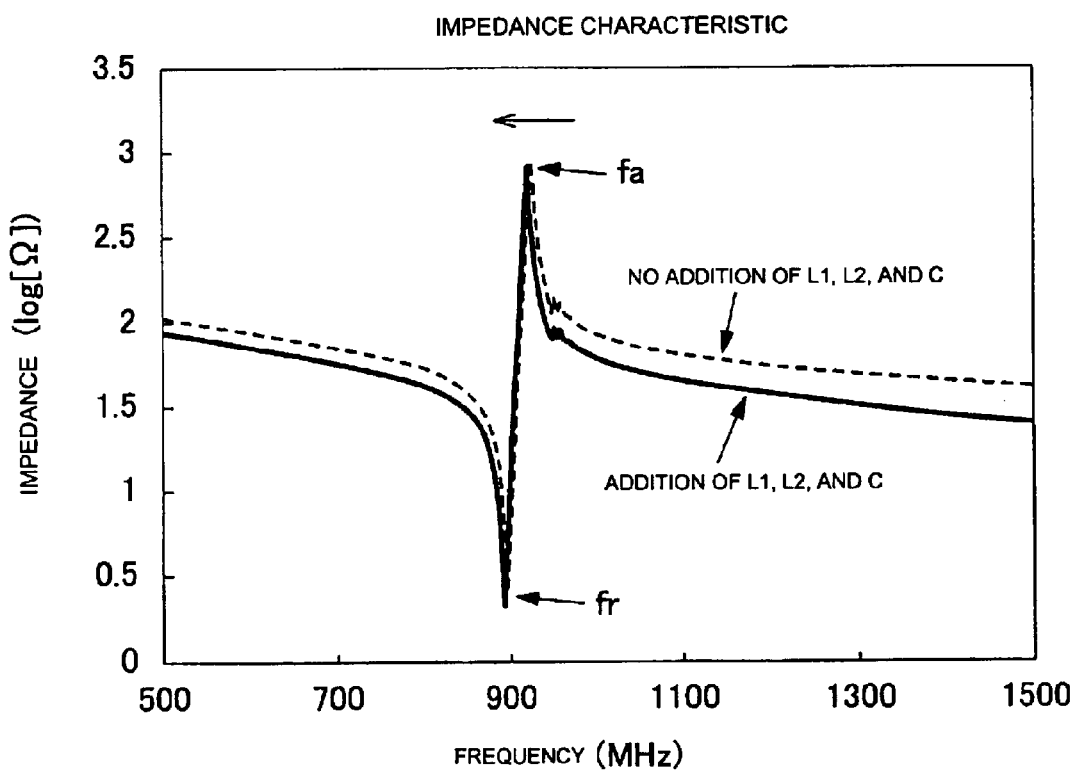
FIG. 28 is a graph showing the impedance characteristic of the configuration according to an embodiment described in Patent Document 4.

FIG. 27 shows the configuration of the series resonator described in the first embodiment of Patent Document 4. FIG. 28 shows the impedance characteristic of the serial resonator having the configuration described in the first embodiment of Patent Document 4. In this case, an inductor L1 connected in parallel to the series resonator has an inductance of 0.1 nH. The inductance of an inductor L2 connected in series with the series resonator is 0.1 nH. The capacitance of a capacitor C connected in parallel to the series resonator is 0.5 pF.

According to the first embodiment of Patent Document 4, the inductor L1 and the capacitor C are connected in parallel to the series resonator, such that the anti-resonance point of the series resonator is shifted toward the lower frequency side, and thus, the interval between the resonance point and the anti-resonance point is decreased. Thus, the steepness on the higher frequency side of the pass-band is increased. The capacitor C plays a role in shifting the anti-resonance point of the series resonator toward the lower frequency side. The Inductor L1 is used to correct the shifting.

Figure 29:
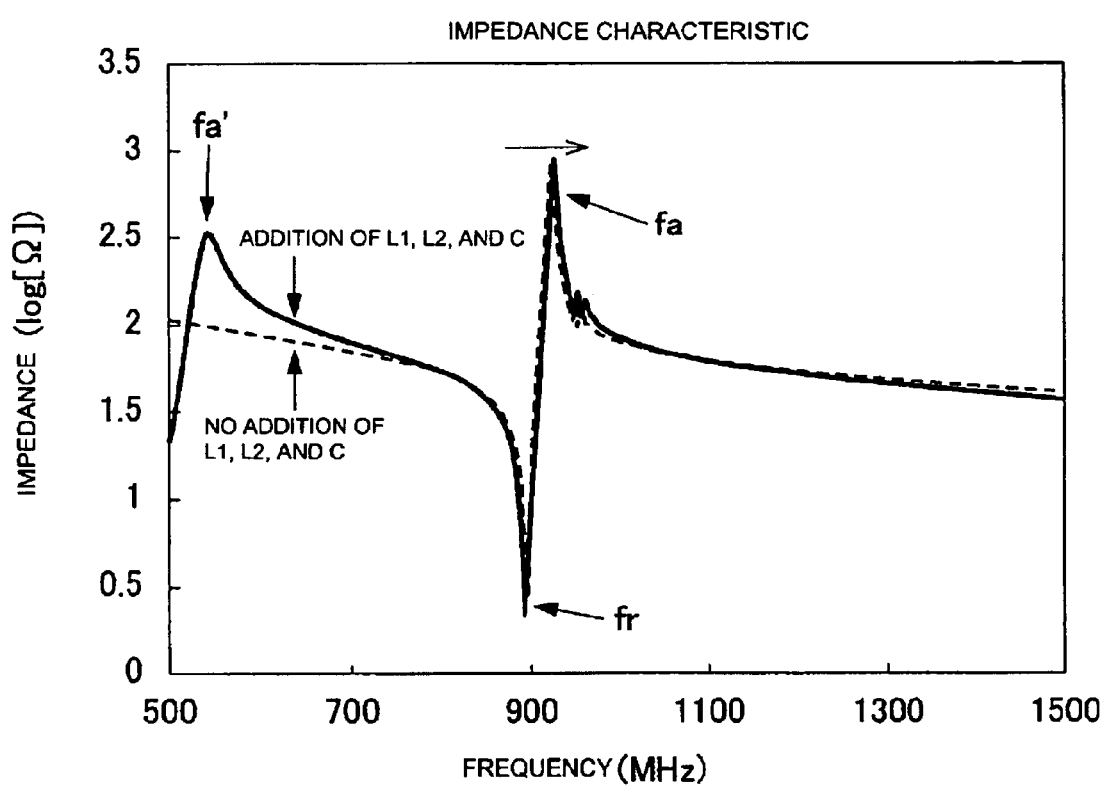
FIG. 29 is a graph showing the impedance characteristic of the configuration according to an embodiment described in Patent Document 4.

FIG. 29 shows the impedance characteristic of the series resonator having the configuration of the second embodiment of Patent Document 4. In this case, the inductance of the inductor L1 connected in parallel is 200 nH. The inductance of the inductor L2 connected in series with the series resonator is 0.5 nH. The capacitance of the capacitor C connected in parallel to the series resonator is 0.5 pF.

According to the second embodiment in Patent Document 4, the inductor and the capacitor are connected in parallel to the series resonator. Thereby, the anti-resonance point of the series resonator is shifted toward the higher frequency side, such that the pass-band width is increased. An anti-resonance point is provided on the lower frequency side of the resonance point of the series resonator. However, this anti-resonance point is not used.

On the other hand, according to this preferred embodiment of the present invention, the inductor is connected in series with the parallel resonator. The resonance point of the parallel resonator is shifted toward the lower frequency side. Thereby, the pass-band width is increased.

In a configuration described in Patent Document 4, two parallel resonators are commonly grounded, and then, an inductor for a pole (L for a pole) is connected in series. The inductor connected in series with the parallel resonator according to the preferred embodiment of the present invention and the inductor for a pole (L for a pole) described in Patent Document 4 have operations and effects which are quite different from each other, as described below.

Figure 30:
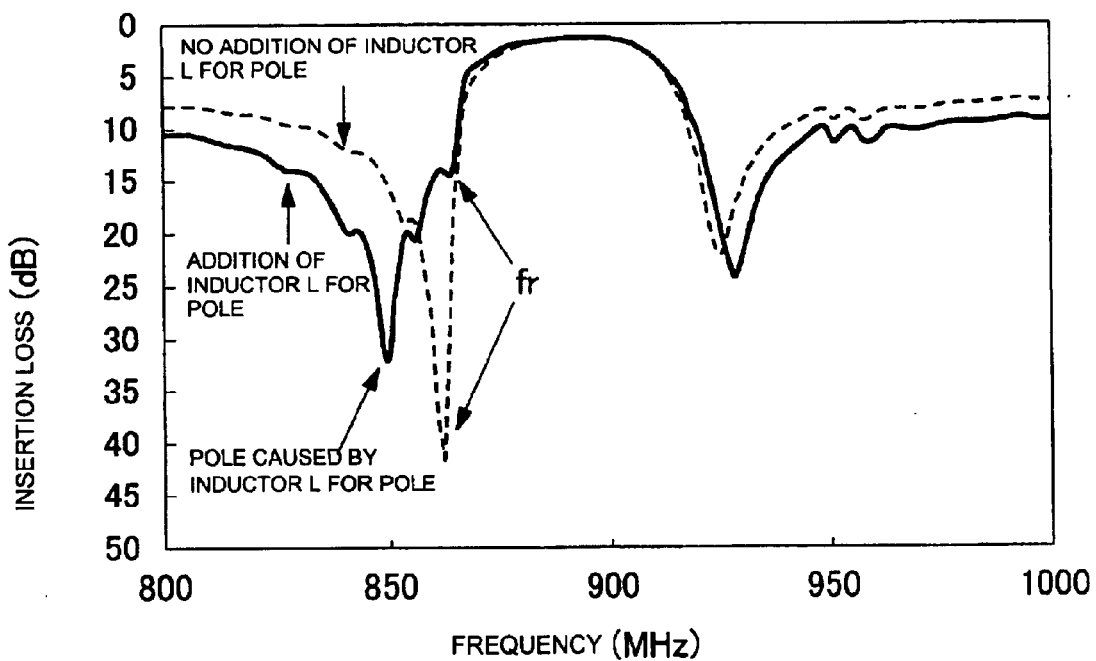
FIG. 30 is a graph showing the transmission characteristic of the configuration according to an embodiment described in Patent Document 4.
Figure 31:
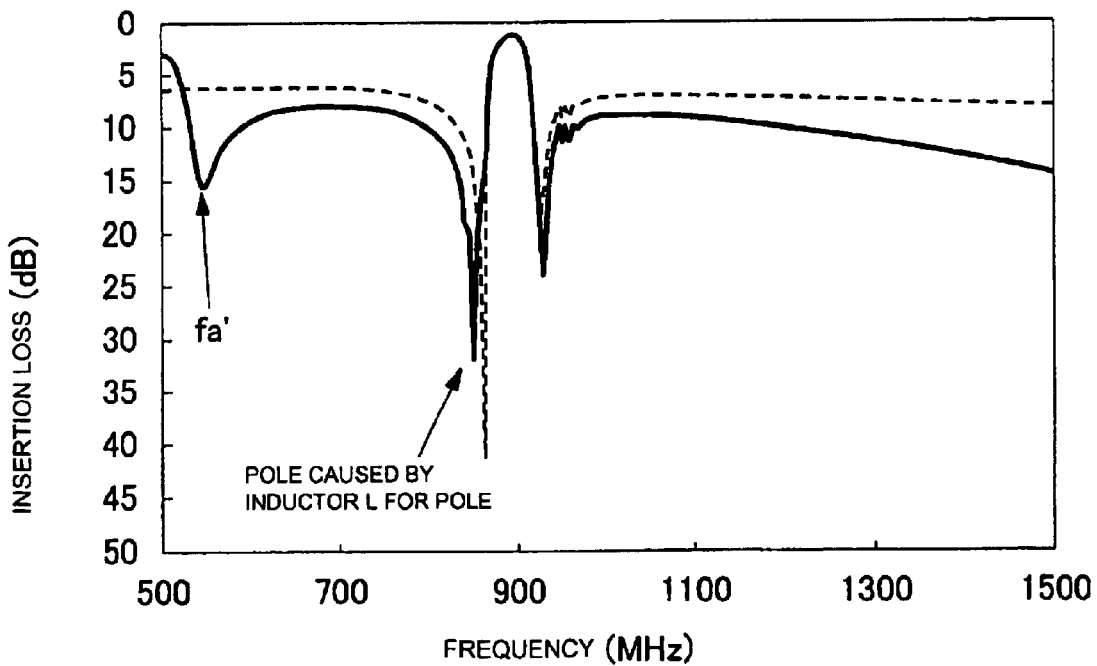
FIG. 31 is a graph showing the transmission characteristic of the configuration according to an embodiment described in Patent Document 4.
Figure 32:
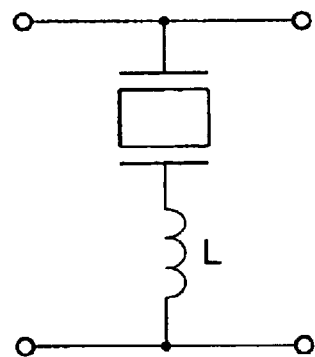
FIG. 32 is a circuit block diagram in which an inductor is connected in series with a parallel resonator according to a preferred embodiment of the present invention.
Figure 33:
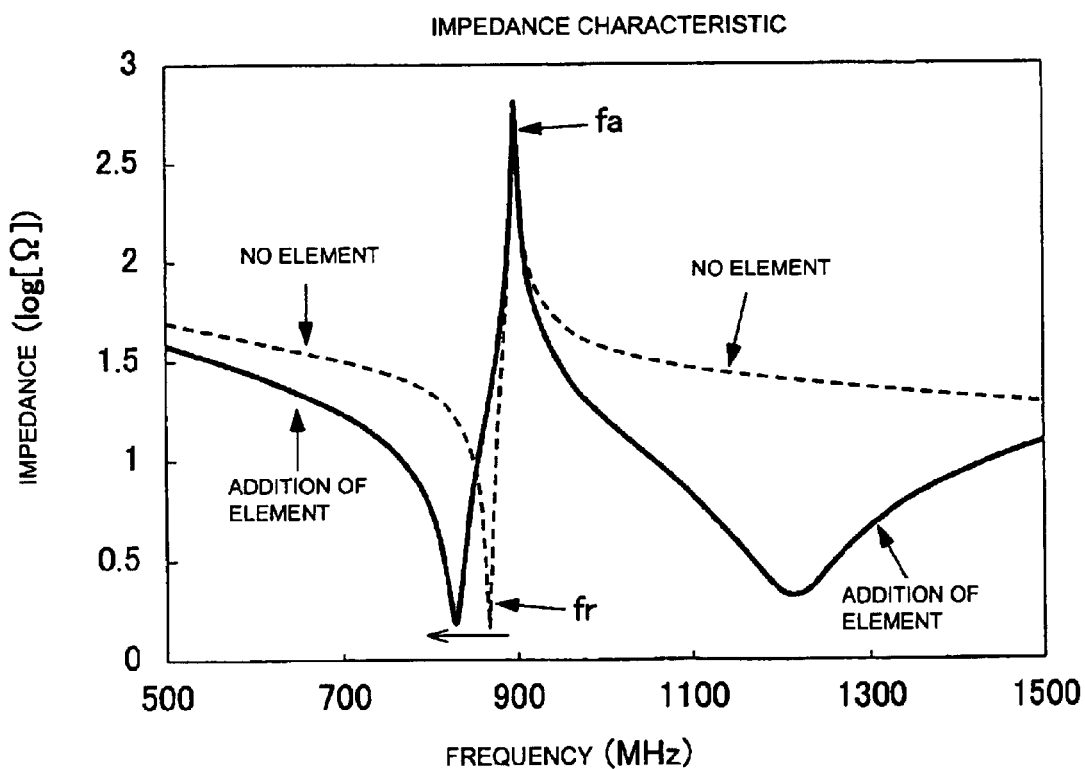
FIG. 33 is a graph showing the impedance characteristic of the circuit shown in FIG. 32.

FIGS. 30 and 31 show the transmission characteristics obtained by the configurations described in the first and second embodiments of Patent Document 4. According to the configurations of Patent Document 4, an attenuation pole is provided on the lower frequency side of the resonance point of the parallel resonator. As described above, the attenuation pole is provided by the connection of the inductor for a pole. In particular, the pole is developed in the case in which the parallel resonators arranged on both of the sides of the series resonator are commonly grounded with each other, and thereafter, the inductor for a pole is added. That is, the pole is not provided where one parallel resonator is provided.

Referring to the attenuation pole caused by the resonance point of the parallel resonator according to preferred embodiments of the present invention, the pole is developed by the resonance point of the parallel resonator which is shifted toward the lower frequency side by the inductor connected in series. Thus, the development mechanism of the attenuation pole obtained by the parallel resonator according to preferred embodiments of the present invention and that of the attenuation pole obtained by the addition of the inductor for a pole are different from each other.

According to Patent Document 4, the anti-resonance point fa' provided by the addition of the parallel inductor to the series resonator exists on the lower frequency side which is separated by at least 200 MHz from the attenuation pole provided by the addition of the inductor for a pole. This shows that the preferred embodiments of the present invention and that of the invention described in Patent Document 4 are very different from each other.

Moreover, the invention described in Patent Document 4 adjusts the frequency at the anti-resonance point of the series resonator. Thus, the anti-resonance point provided on the lower frequency side of the pass-band is not taken into account at all. Thus, the attenuation on the lower frequency side of the pass-band cannot be increased. Moreover, the function of the inductor connected to the parallel resonator is very different from that of the inductor according to preferred embodiments of the present invention.

Hereinafter, the preferred range of the capacitance of a resonator according to preferred embodiments of the present invention will be described. According to preferred embodiments of the present invention, the inductor is connected in parallel to the series resonator, such that the anti-resonant point of the series resonator is provided on the lower frequency side of the resonant point of the series resonator. Moreover, the inductor is connected in series with the parallel resonator, such that the resonant point of the parallel resonator is shifted toward the lower frequency side (see FIG. 32). Accordingly, the anti-resonant point of the series resonator and the resonant point of the parallel resonator substantially coincide with each other in an attenuation band which is on the lower frequency side of the pass-band. Thus, an attenuation pole is provided, that is, a greatly increased attenuation is obtained (see FIG. 33).

The frequencies and the attenuations at the attenuation poles are determined by the capacitances of the series resonator and the parallel resonator and the inductances of the inductors connected to the series and parallel resonators. The frequencies at the attenuation poles can be adjusted to be equal to each other by changing the inductances of the inductors as described above in correspondence to the capacitances of the resonators.

Figure 34:
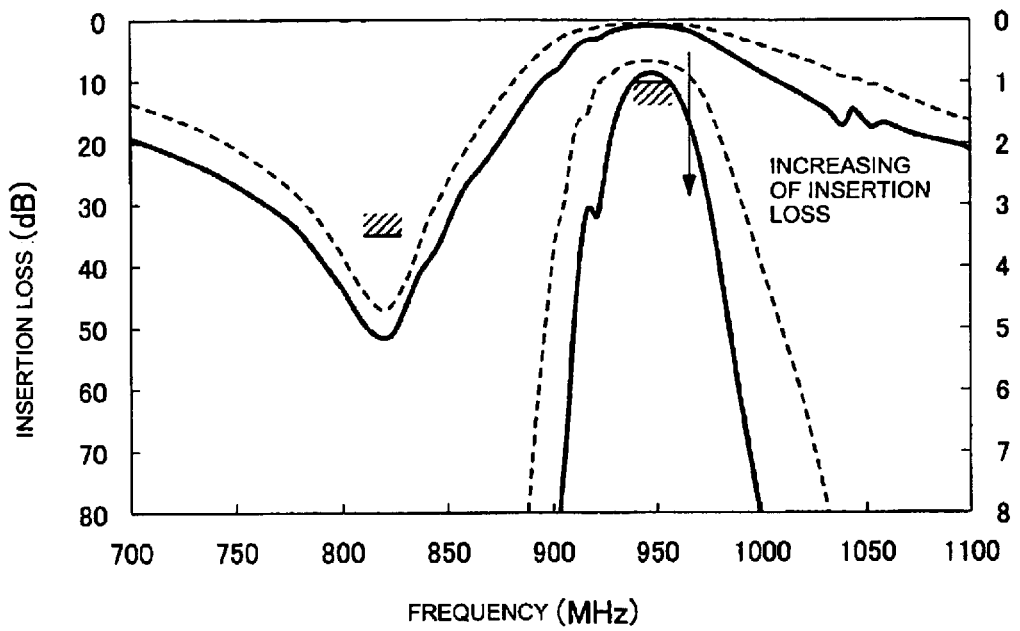
FIG. 34 is a graph showing the transmission characteristic of the ladder type filter according to a preferred embodiment of the present invention and that of a filter as a comparative example in which the capacitance of the series resonator is set at a small value.
Figure 35:
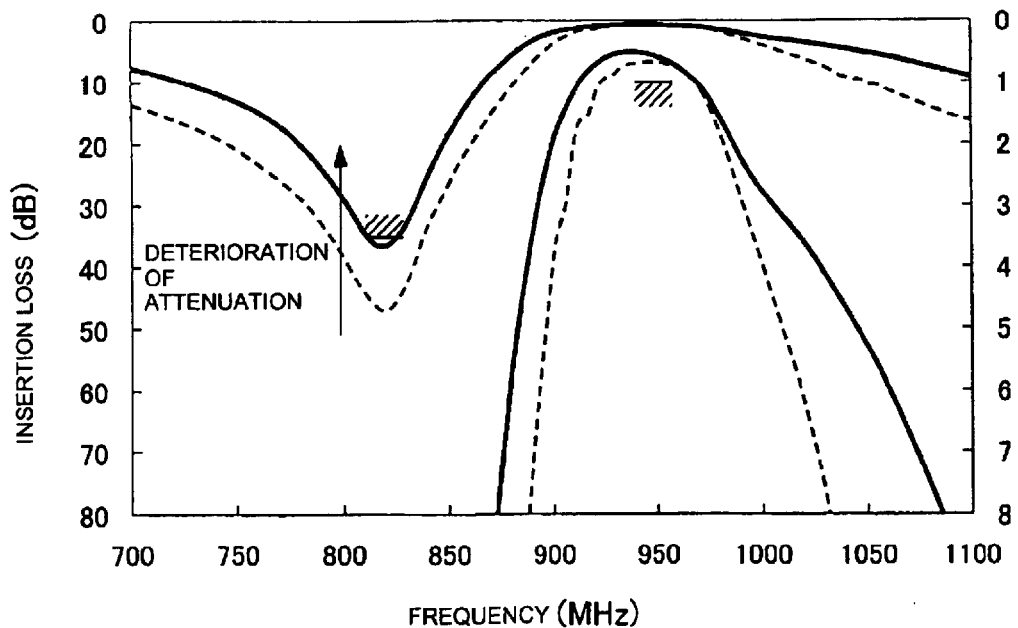
FIG. 35 is a graph showing the transmission characteristic of the ladder type filter according to a preferred embodiment of the present invention and that of a filter as a comparative example in which the capacitance of the series resonator is set at a large value.

As shown in FIG. 34, the capacitance of the series resonator is decreased from about 1.29 pF (broken line) to about 0.65 pF (solid line), while the frequency at the attenuation pole is maintained at a constant value, the attenuation characteristic is greatly improved, but the insertion loss tends to increase. On the contrary, as shown in FIG. 35, when the capacitance of the series resonator is increased from about 1.29 pF (broken line) to about 3.22 pF (solid line), the insertion loss is greatly improved, but the attenuation characteristic is deteriorated.

Figure 36:
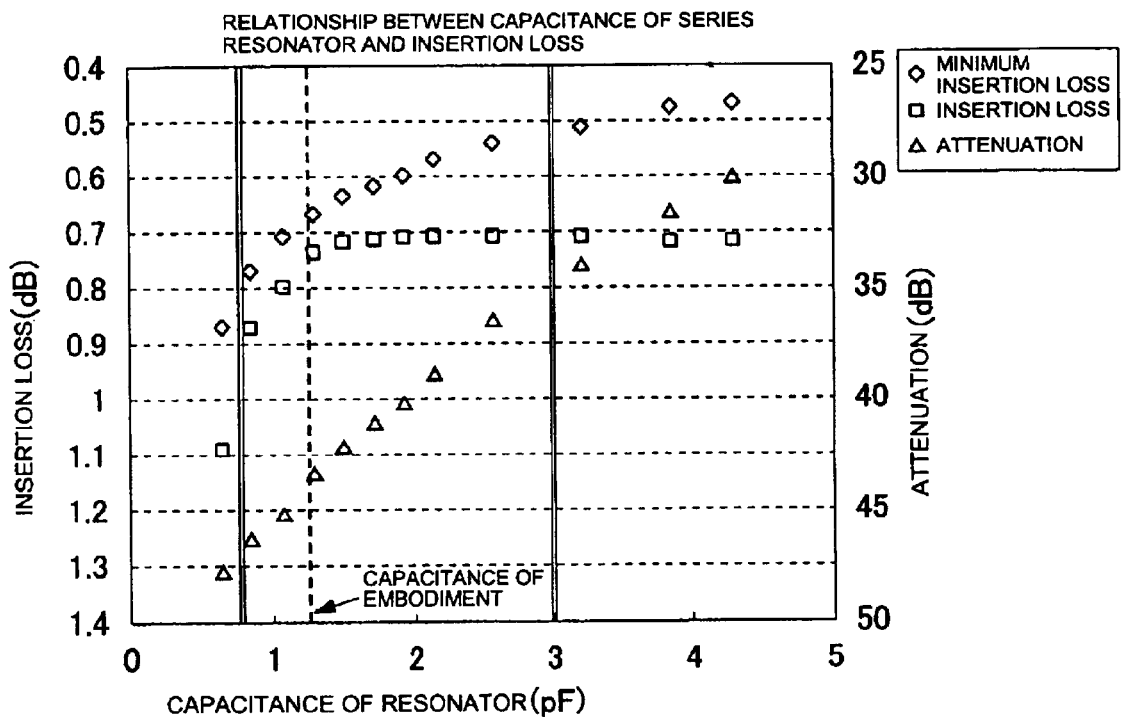
FIG. 36 is a graph showing the relationship between the capacitance of the series resonator and the respective characteristics according to a preferred embodiment of the present invention.
Figure 37:
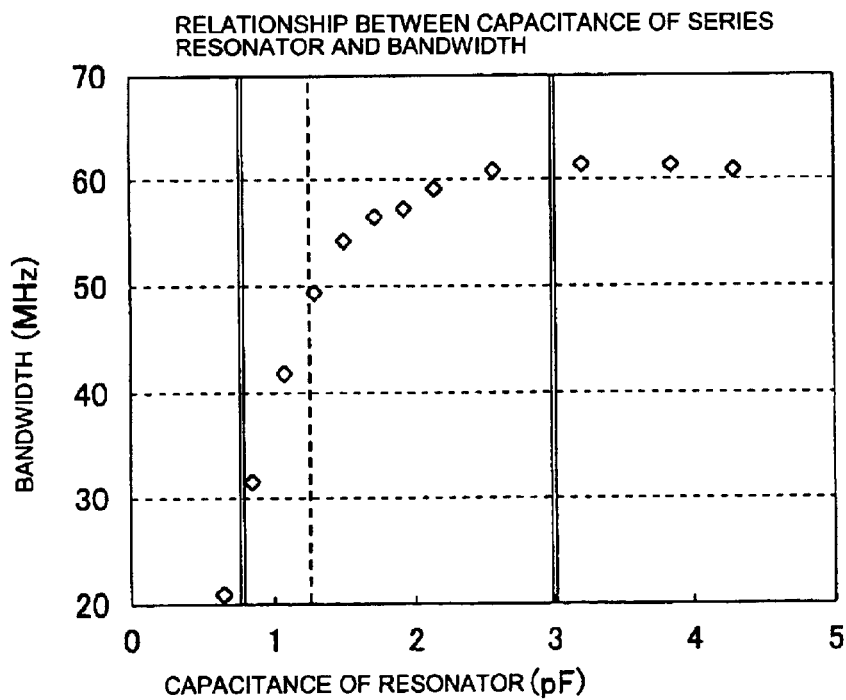
FIG. 37 is a graph showing the relationship between the capacitance of the series resonator and the bandwidth (decreased by 1 dB) according to a preferred embodiment of the present invention.

A simulation test was performed, in which a 41° Y cut-X propagation LiNbO$_3$ substrate was used, and the number of electrode pairs of a series resonator was changed, causing the capacitance of the series resonator to change. FIGS. 36 and 37 and Table 2 show the simulation results. The bandwidth shown in FIG. 37 is defined by the width of the frequency at which the minimum insertion loss is exhibited to the frequency at which the insertion loss less than the minimum insertion loss by 1 dB. It should be noted that to keep the frequency at the attenuation pole constant, the inductance of the inductor connected in parallel was changed in correspondence with the change of the capacitance of the series resonator.

TABLE 2

| Capacitance (pF) | Number of pairs | Meshing width (μm) | Duty | Added inductance (nH) | Insertion loss (dB) | Attenuation (dB) | Bandwidth (MHz) |
|---|---|---|---|---|---|---|---|
| 0.65 | 30 | 50 | 0.4 | 24.0 | 1.09 | 47.79 | 21.010 |
| 0.86 | 40 | 50 | 0.4 | 18.5 | 0.87 | 46.33 | 31.493 |
| 1.08 | 50 | 50 | 0.4 | 15.0 | 0.80 | 45.19 | 41.909 |
| 1.29 | 60 | 50 | 0.4 | 12.5 | 0.74 | 43.32 | 49.278 |
| 1.50 | 70 | 50 | 0.4 | 10.5 | 0.72 | 42.09 | 54.196 |
| 1.72 | 80 | 50 | 0.4 | 9.2 | 0.72 | 41.02 | 56.403 |
| 1.93 | 90 | 50 | 0.4 | 8.2 | 0.71 | 40.17 | 57.077 |
| 2.15 | 100 | 50 | 0.4 | 7.2 | 0.71 | 38.88 | 58.985 |
| 2.58 | 120 | 50 | 0.4 | 5.8 | 0.71 | 36.53 | 60.750 |
| 3.22 | 150 | 50 | 0.4 | 4.5 | 0.71 | 34.02 | 61.332 |
| 3.86 | 180 | 50 | 0.4 | 3.6 | 0.72 | 31.58 | 61.152 |
| 4.29 | 200 | 50 | 0.4 | 3.1 | 0.72 | 30.05 | 60.818 |

As seen in FIGS. 36 and 37 and Table 2, with decreasing capacitance, the attenuation is increased, but the insertion loss is increased, and the bandwidth is reduced. Broken lines depicted along the Y-axis in FIGS. 36 and 37 represents the results of the example (the capacitance is 1.29 pF) of preferred embodiments of the present invention.

The characteristics of branching filters (duplexer) required in the PDC market are very severe. Regarding the characteristics of branching filters which are typically used, the insertion loss must be up to about 1.2 dB, and the attenuation must be at least about 38 dB at branching. If the deterioration of the insertion loss by about 0.3 dB and the improvement of the attenuation by about 3 dB, caused by use of a branching filter, are taken into account, it is desirable that the branching filter has an insertion loss of up to about 0.9 dB and an attenuation of at least about 35 dB.

Referring to the design according to a preferred embodiment of the present invention, when the capacitance of the series resonator is decreased to be less than about 0.8 pF, the insertion loss increases to greater than 0.9 dB, that is, the insertion loss rapidly deteriorates. Moreover, when the capacitance is increased, the attenuation deteriorates. When the capacitance exceeds about 3 pF, the insertion loss deteriorates to less than about 35 dB. Accordingly, the capacitance of the series resonator is set to be in the range of from about 0.8 pF to about 3 pF (double lines extended along the Y-axis in FIGS. 36 and 37).

Figure 38:
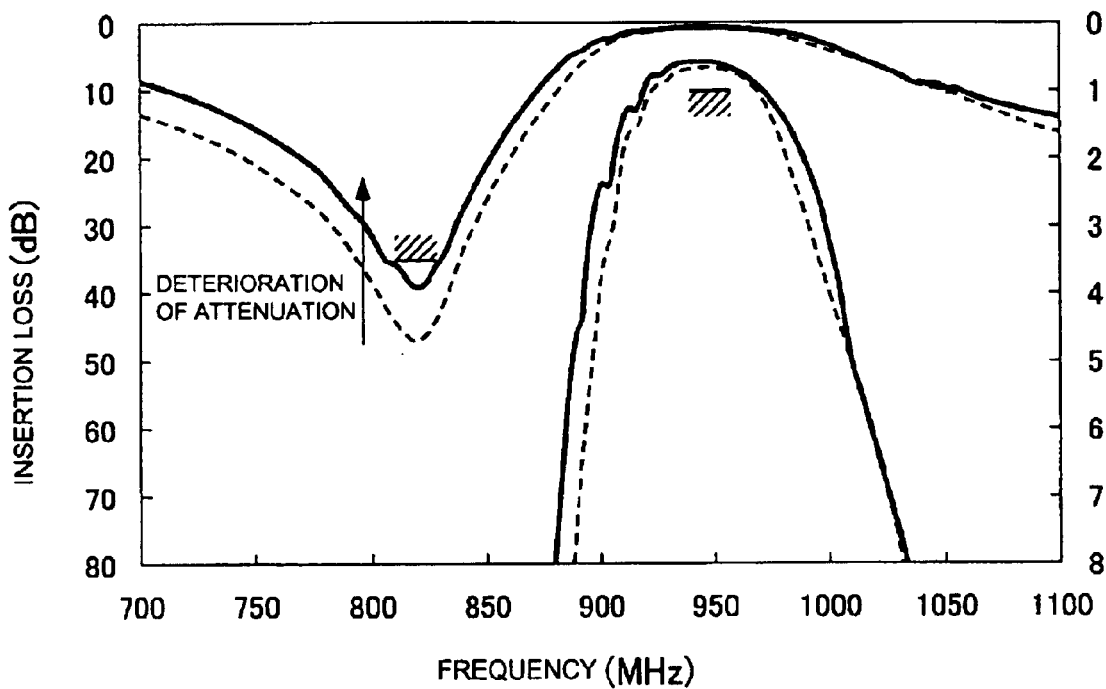
FIG. 38 is a graph showing the transmission characteristic of the ladder type filter according to a preferred embodiment of the present invention and that of a filter as a comparative example in which the capacitance of the parallel resonator is set at a small value.
Figure 39:
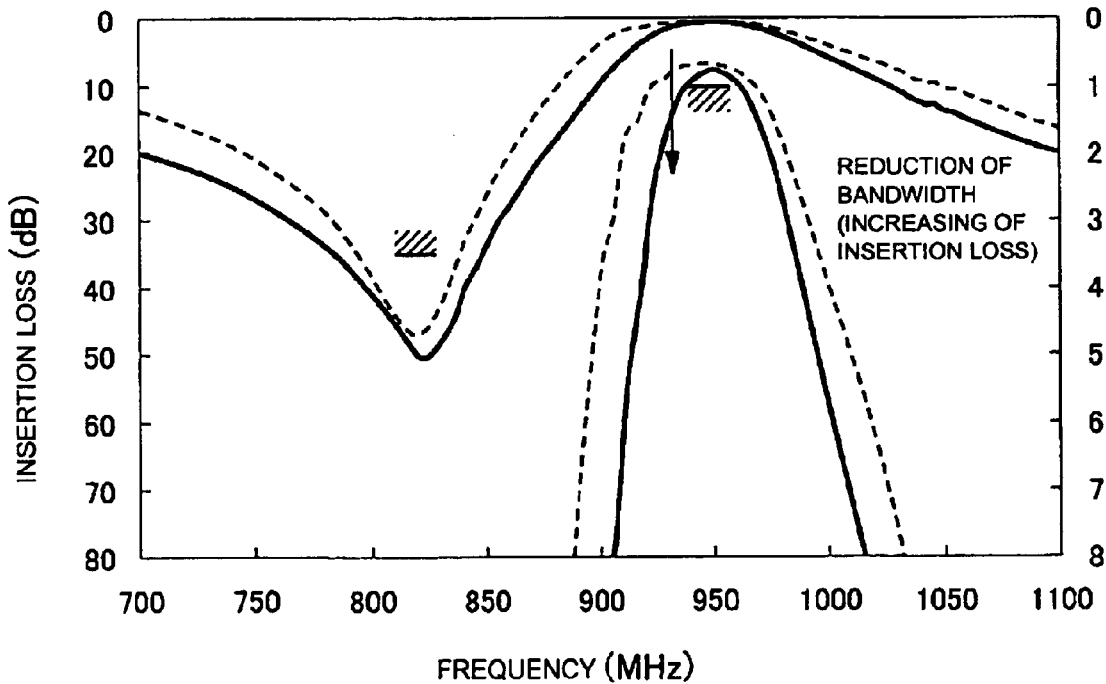
FIG. 39 is a graph showing the transmission characteristic of the ladder type filter according to a preferred embodiment of the present invention and that of a filter as a comparative example in which the capacitance of the parallel resonator is set at a large value.

Moreover, FIGS. 38 and 39 show the results of the simulation in which the capacitance of the parallel resonator was changed. When the capacitance of the parallel resonator is decreased from about 4.29 pF (broken line) to about 1.08 pF (solid line), the insertion loss is improved, but the attenuation is deteriorated as shown in FIG. 38. Moreover, when the capacitance of the parallel resonator is increased from about 4.29 pF (broken line) to about 10.7 pF (solid line), the bandwidth is reduced, and the insertion loss is deteriorated as seen in FIG. 39.

Figure 40:
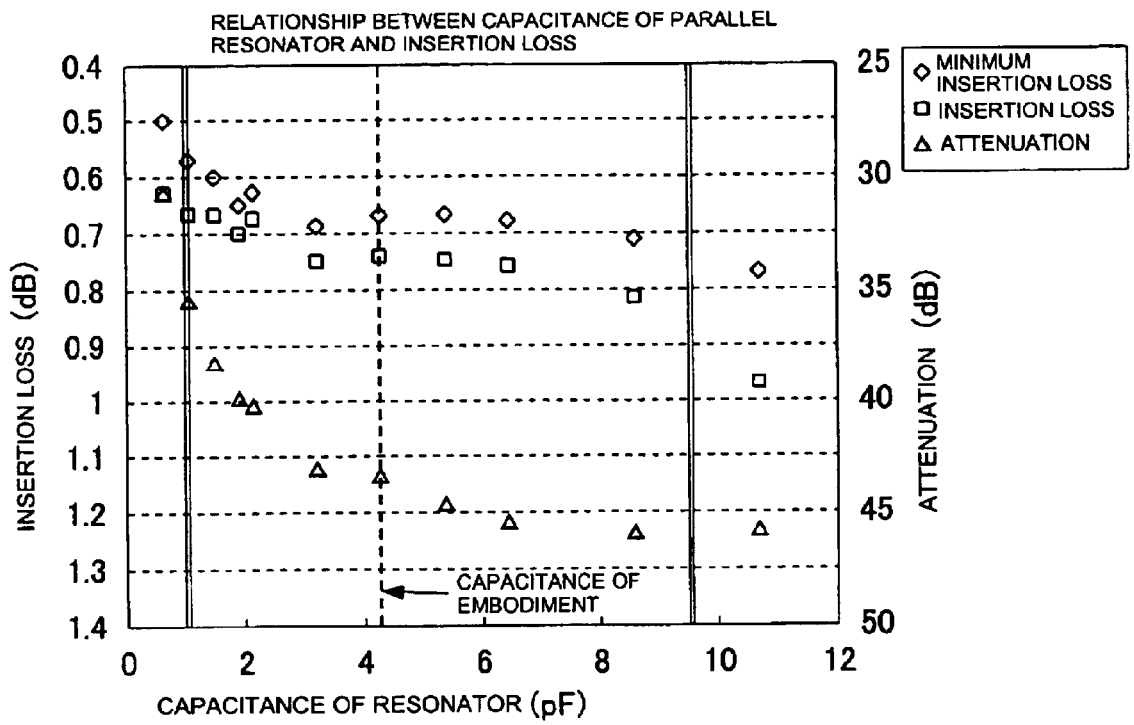
FIG. 40 is a graph showing the relationship between the capacitance of the parallel resonator and the respective characteristics according to a preferred embodiment of the present invention.
Figure 41:
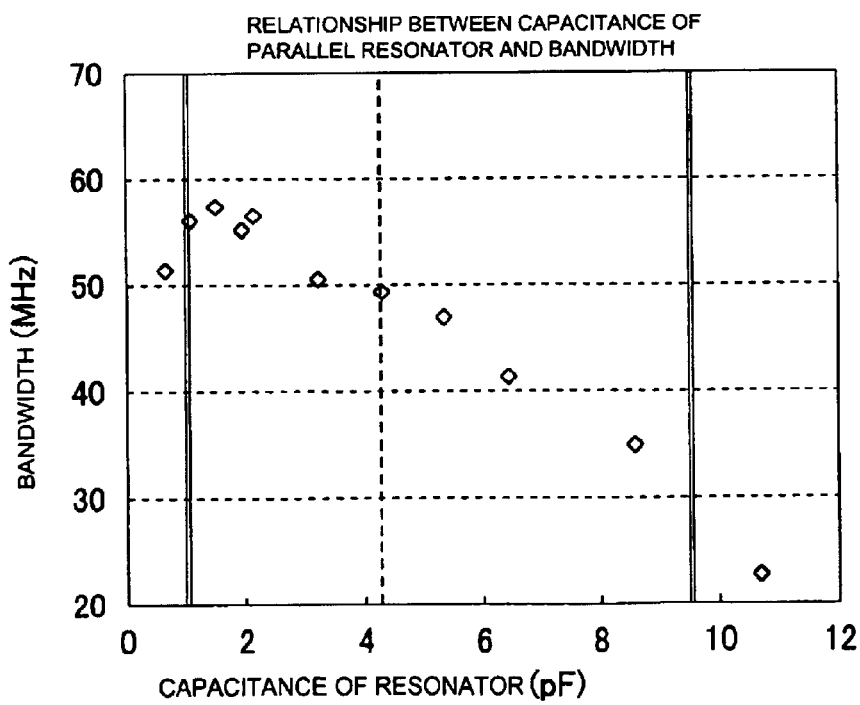
FIG. 41 is a graph showing the relationship between the capacitance of the parallel resonator and the bandwidth (decreased by 1 dB) according to a preferred embodiment of the present invention.

FIGS. 40 and 41 and Table 3 show the results of the simulation in which a 41° Y cut—X propagation LiNbO$_3$ was used, and the number of electrode pairs of the resonator was changed, such that the capacitance of the parallel resonator was changed. It should be noted that the inductance of the inductor connected in series was changed to maintain the frequency at the attenuation pole at a constant value in correspondence with the change in capacitance of the parallel resonator. Broken lines extended along the y-axis in FIGS. 40 and 41 represent the measurement results (the capacitance was 4.29 pF) of examples of the preferred embodiments of the present invention. The bandwidth shown in FIG. 41 was measured in a manner similar to that shown in FIG. 37.

TABLE 3

| Capacitance (pF) | Number of pairs | Meshing width (μm) | Duty | Added inductance (nH) | Insertion loss (dB) | Attenuation (dB) | Bandwidth (MHz) |
|---|---|---|---|---|---|---|---|
| 0.65 | 30 | 50 | 0.4 | 16.5 | 0.63 | 30.77 | 51.304 |
| 1.08 | 50 | 50 | 0.4 | 11.0 | 0.67 | 35.50 | 56.123 |
| 1.50 | 70 | 50 | 0.4 | 8.2 | 0.67 | 38.27 | 57.331 |
| 1.93 | 90 | 50 | 0.4 | 6.2 | 0.70 | 39.85 | 55.316 |
| 2.15 | 100 | 50 | 0.4 | 5.7 | 0.68 | 40.20 | 56.398 |
| 3.22 | 150 | 50 | 0.4 | 3.5 | 0.75 | 43.05 | 50.505 |
| 4.29 | 200 | 50 | 0.4 | 2.7 | 0.74 | 43.32 | 49.278 |
| 5.36 | 250 | 50 | 0.4 | 2.1 | 0.75 | 44.70 | 46.866 |
| 6.43 | 300 | 50 | 0.4 | 1.7 | 0.76 | 45.52 | 41.261 |
| 8.58 | 400 | 50 | 0.4 | 1.2 | 0.82 | 45.95 | 34.885 |
| 10.7 | 500 | 50 | 0.4 | 0.8 | 0.97 | 45.80 | 22.686 |

The capacitance of the parallel resonator at which the insertion loss of up to about 0.9 dB or the attenuation of at least about 35 dB is achieved is in the range of from about 1 pF to about 9.5 pF (double lines extended along the Y-axis in FIGS. 40 and 41), which was determined in a similar manner to that of the series resonator.

Moreover, in the above-described preferred embodiments and examples, SAW filters are preferably used for the ladder type filters. The above-description is not restrictive. Even if a piezoelectric thin-film filter (piezoelectric thin-film filter element) is used instead of the SAW filter, a ladder type filter having the same advantages as stated in the above-described preferred embodiments and examples is provided.

Figure 42:
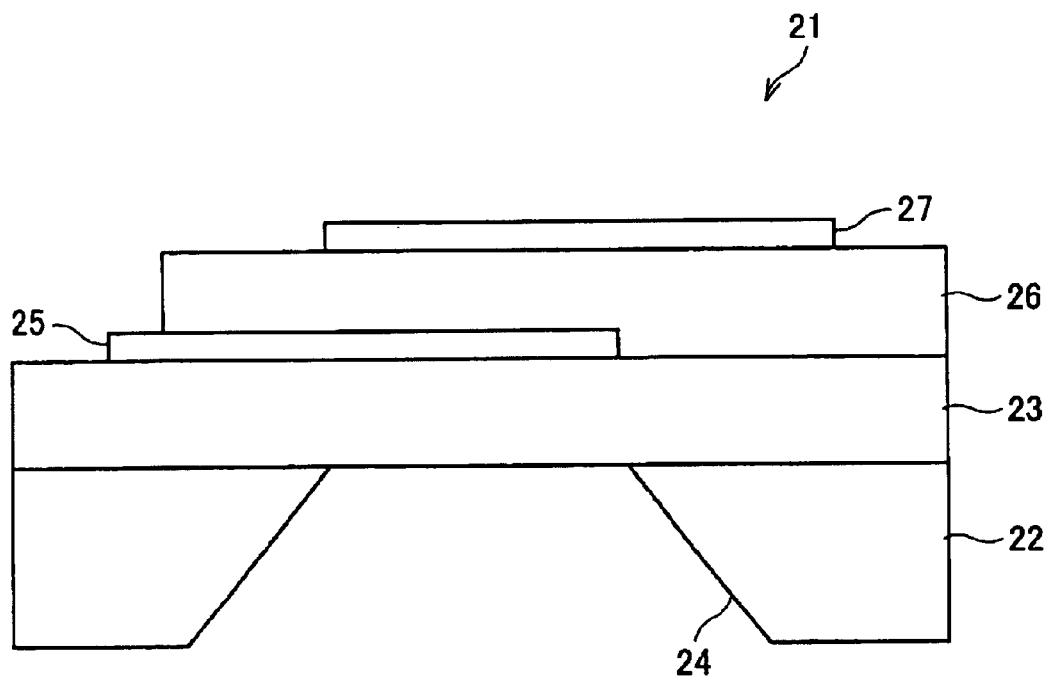
FIG. 42 is a cross-sectional view of a piezoelectric thin-film resonator for use in the ladder type filter of various preferred embodiments of the present invention.

As a piezoelectric thin-film resonator arranged in a ladder configuration in the above-described piezoelectric thin-film filter, the resonator shown in FIG. 42 is preferably used, for example. As shown in FIG. 42, a piezoelectric thin-film resonator 21 is provided with an insulating film 23 which is arranged so as to cover an aperture 24 of a supporting substrate 22 made of silicon. A lower electrode 25 and an upper electrode 27 are arranged on the insulating film 23 so as to sandwich a piezoelectric thin-film 26 substantially in a location above the aperture 24 in the upper and lower direction (in the thickness direction of the piezoelectric thin-film 26).

Thus, in the piezoelectric thin-film resonator 21, a diaphragm structure defining a vibration portion is provided with a portion of the piezoelectric thin-film 26 sandwiched by the lower electrode 25 and the upper electrode 27, and the insulating film 23. The aperture 24 is formed so as to pass through the supporting substrate 22 in the thickness direction. The insulating film 23 is made of silicon dioxide ($SiO_2$) or alumina ($Al_2O_3$), or has a multilayer structure. The piezoelectric thin-film 26 is made of zinc oxide (ZnO), aluminum nitride (AlN), or other suitable material.

Figure 43:
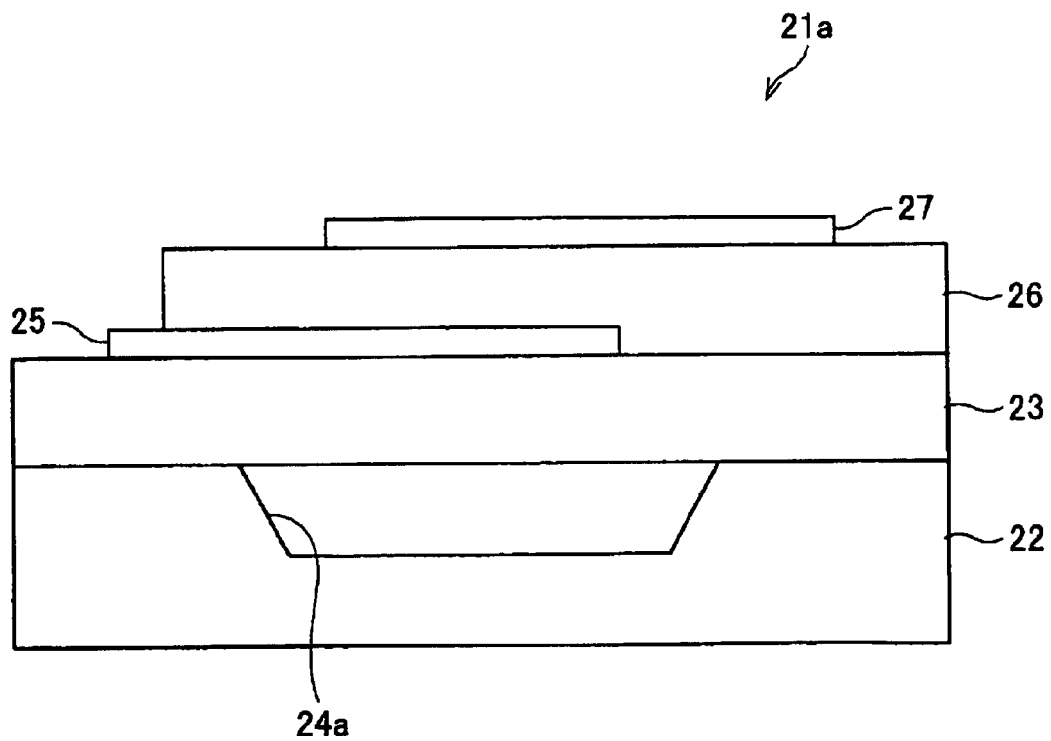
FIG. 43 is a cross-sectional view of a modification of the piezoelectric thin-film resonator.

Moreover, in a piezoelectric thin-film resonator 21a shown in FIG. 43, a convexity 24a is provided on the supporting substrate 22, instead of the aperture 24, so as to be opposed to the diaphragm structure of the resonator 21a, and so as not to extend entirely through the supporting substrate 22 in the thickness direction.

Hereinafter, a communication device including the surface acoustic wave filter and the piezoelectric thin-film filter described in the other preferred embodiments will be described with reference to FIG. 44. A communication device 100 preferably includes, on the receiver side (Rx side) for reception, an antenna 101, an antenna commonly used portion (branching filter)/an RF Top filter 102, an amplifier 103, an Rx-inter-stage filter 104, a mixer 105, a 1st IF filter 106, a mixer 107, a 2nd IF filter 108, a 1st+2nd local synthesizer 111, TCXO (temperature compensated crystal oscillator) 112, a divider 113, and a local filter 114.

Figure 44:
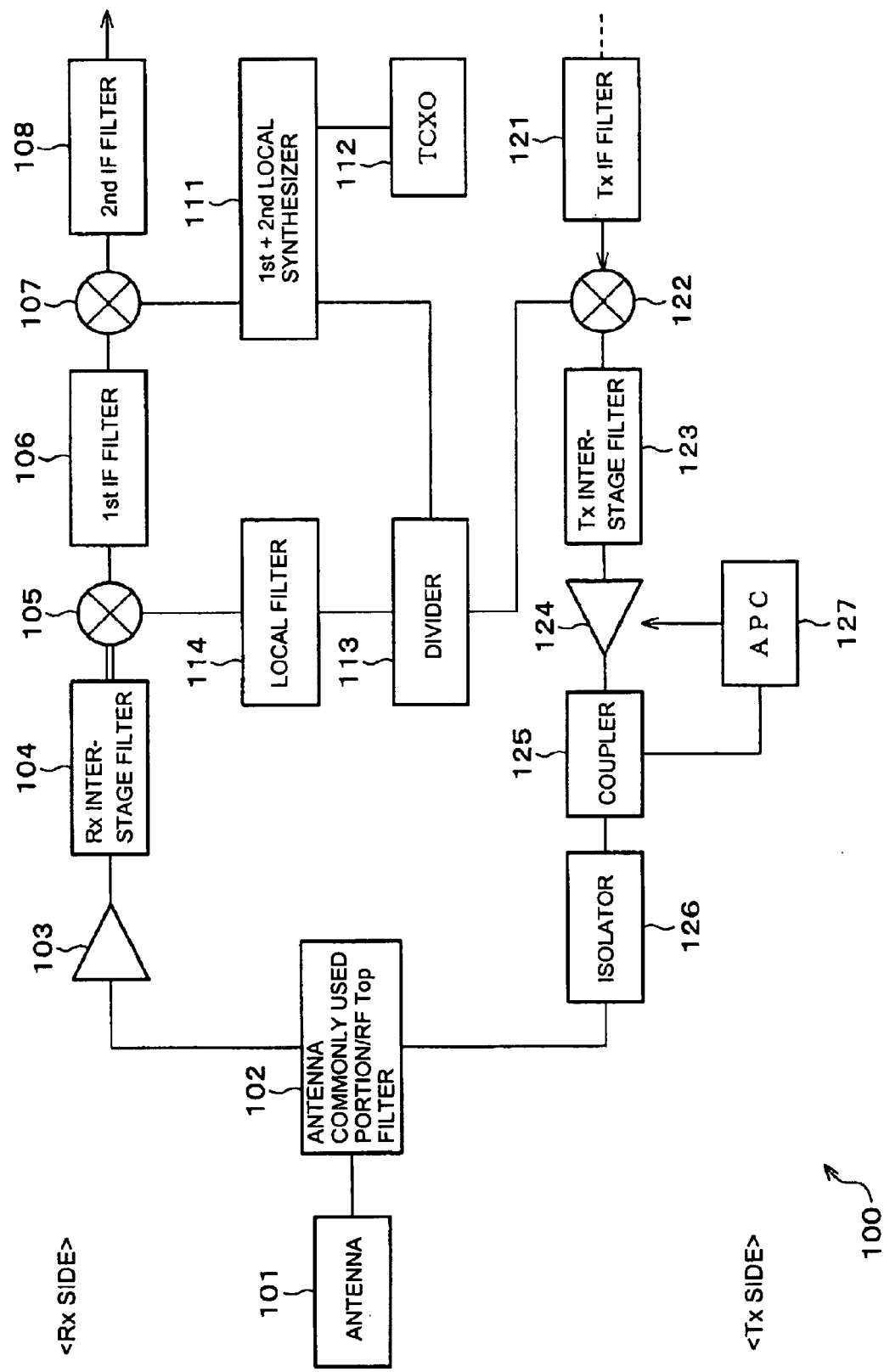
FIG. 44 is a block diagram showing the essential portion of a communication device which includes the surface acoustic wave filter and the piezoelectric thin-film filter according to various preferred embodiments of the present invention.
Figure 45:
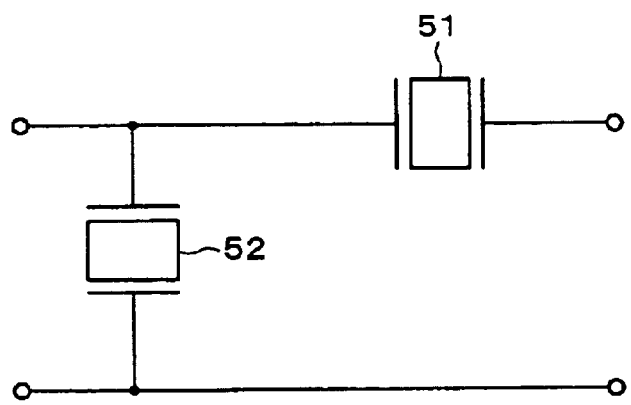
FIG. 45 shows the basic configuration of a known ladder type filter.
Figure 46:
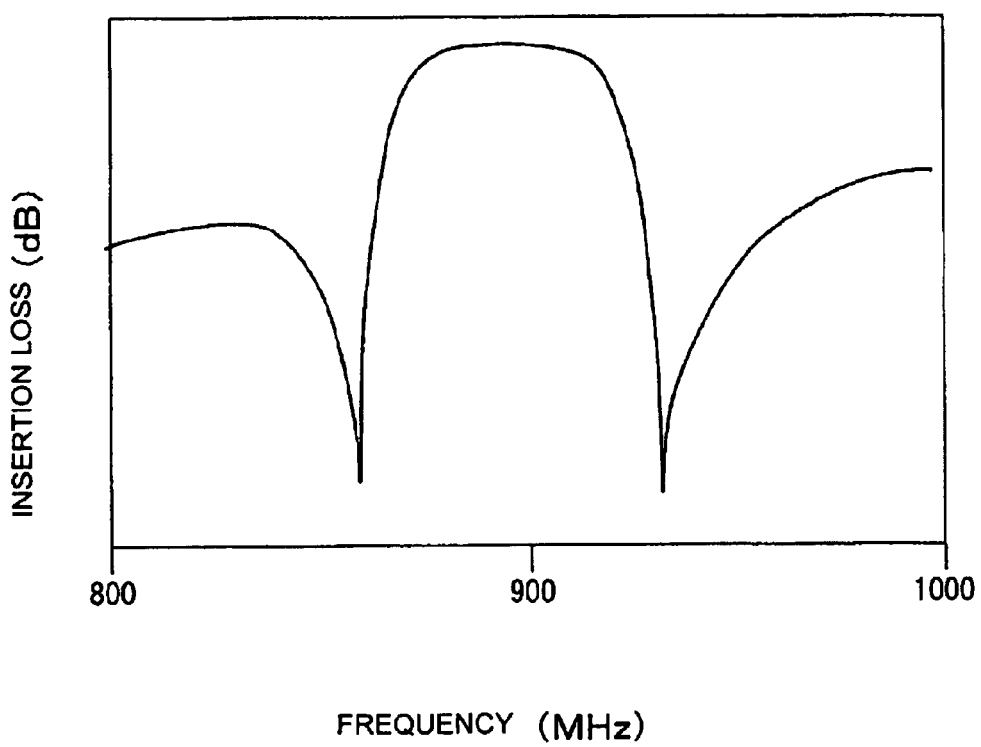
FIG. 46 is a graph showing the typical characteristic of the known ladder type filter.

To ensure balancing, preferably, balanced signals are transmitted from the Rx inter-stage filter 104 to the mixer 105, as represented by double-lines in FIG. 44.

Moreover, the communication device 100 preferably includes, on the transmitter side (Tx side) for transmission, the antenna 101, and the antenna commonly used portion/RF Top filter 102 which are used in common with the Rx side, a Tx IF filter 121, a mixer 122, a Tx inter-stage filter 123, a amplifier 124, a coupler 125, an isolator 126, and APC (automatic power control) 127.

The above-described surface acoustic wave filters and the piezoelectric thin-film filters according to preferred embodiments of the present invention are suitable for used as the antenna commonly used portion/RF Top filter 102, the Rx inter-stage filter 104, the 1st IF filter 106, the Tx IF filter 121, and the Tx inter-stage filter 123.

The surface acoustic wave filter and the piezoelectric thin-film filter according to preferred embodiments of the present invention have superior filter-functions as described above. Thus, the communication device according to another preferred embodiment of the present invention, which includes the surface acoustic wave filter and the piezoelectric thin-film, has greatly improved transmission characteristics.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A ladder type filter comprising:
   a filter element including at least one series resonator and at least one parallel resonator arranged in a ladder configuration, said at least one series resonator having an inductor connected in parallel thereto; wherein
   an anti-resonant point on the lower frequency side of the resonant point of the at least one series resonator, caused by the inductor connected in parallel, and the resonant point of the at least one parallel resonator substantially coincide with each other.

2. A ladder type filter according to claim 1, wherein the at least one parallel resonator includes at least two resonators connected in parallel to each other.

3. A ladder type filter according to claim 1, wherein the at least one parallel resonator includes at least two resonators connected in series with each other.

4. A ladder type filter according to claim 1, wherein the at least one series resonator includes at least two resonators connected in series with each other.

5. A ladder type filter according to claim 1, wherein the at least one series resonator includes at least two resonators connected in parallel to each other.

6. A ladder type filter according to claim 1, wherein the inductor includes at least one of a chip coil and a bonding wire.

7. A ladder type filter according to claim 1, wherein the filter element is mounted in a package, and the inductor includes a wiring arranged in the package.

8. A ladder type filter according to claim 1, wherein the filter element is mounted in a package, and the inductor includes a wiring pattern disposed on a mounting substrate on which the package including the filter element is mounted.

9. A ladder type filter according to claim 1, wherein the at least one series resonator has a capacitance of about 0.8 pF to about 3 pF.

10. A ladder type filter according to claim 1, wherein the at least one parallel resonator has a capacitance of about 1 pF to about 9.5 pF.

11. A ladder type filter according to claim 1, wherein at least one of the at least one series resonator and the at least one parallel resonator is a one terminal-pair surface acoustic wave resonator including a plurality of interdigital electrode portions provided on a piezoelectric substrate, and the filter element is a surface acoustic wave element.

12. A ladder type filter according to claim 1, wherein at least one of the at least series resonator and the at least one parallel resonator is a piezoelectric thin-film resonator including a substrate having an aperture or concavity provided therein, and a vibrating portion arranged over the aperture or concavity, said vibrating portion includes at least one layer of a piezoelectric thin film and at least one pair of an upper electrode and a lower electrode, and said piezoelectric thin film is sandwiched between the upper electrode and the lower electrode such that the upper and lower electrodes are opposed to upper and lower surfaces of the piezoelectric thin film, respectively, and the filter element is a piezoelectric thin film filter element.

13. A branching filter comprising the ladder type filter of claim 1 which defines a filter having a pass-band on a higher frequency side of the branching filter.

14. A communication device comprising the branching filter of claim 13.

15. A communication device comprising the ladder type filter of claim 1.

16. A ladder type filter comprising:
   a filter element including at least one series resonator and at least one parallel resonator arranged in a ladder configuration, said at least one parallel resonator having a first inductor connected in series therewith, and said at least one series resonator having a second inductor connected in parallel thereto; wherein
   a resonant point of the at least one parallel resonator is shifted toward the lower frequency side by the first inductor connected in series thereto, and an anti-resonant point on the lower frequency side of the resonant point of the at least one series resonator, caused by the second inductor connected in parallel, substantially coincide with each other.

17. A ladder type filter according to claim 16, wherein the at least one parallel resonator includes at least two resonators connected in parallel to each other.

18. A ladder type filter according to claim 16, wherein the at least one parallel resonator includes at least two resonators connected in series with each other.

19. A ladder type filter according to claim 16, wherein the at least one series resonator includes at least two resonators connected in series with each other.

20. A ladder type filter according to claim 16, wherein the at least one series resonator includes at least two resonators connected in parallel to each other.

21. A ladder type filter according to claim 16, wherein the inductor includes at least one of a chip coil and a bonding wire.

22. A ladder type filter according to claim 16, wherein the filter element is mounted in a package, and the inductor includes a wiring arranged in the package.

23. A ladder type filter according to claim 16, wherein the filter element is mounted in a package, and the inductor includes a wiring pattern disposed on a mounting substrate on which the package including the filter element is mounted.

24. A ladder type filter according to claim 16, wherein the series resonator has a capacitance of about 0.8 pF to about 3 pF.

25. A ladder type filter according to claim 16, wherein the parallel resonator has a capacitance of about 1 pF to about 9.5 pF.

26. A ladder type filter according to claim 16, wherein at least one of the at least one series resonator and the at least one parallel resonator is a one terminal-pair surface acoustic wave resonator including a plurality of interdigital electrode portions provided on a piezoelectric substrate, and the filter element is a surface acoustic wave element.

27. A ladder type filter according to claim 16, wherein at least one of the at least one series resonator and the at least one parallel resonator is a piezoelectric thin-film resonator including a substrate having an aperture or concavity provided therein, and a vibrating portion arranged over the aperture or concavity, said vibrating portion includes at least one layer of a piezoelectric thin film and at least one pair of an upper electrode and a lower electrode, and said piezoelectric thin film is sandwiched between the upper electrode and the lower electrode such that the upper and lower electrodes are opposed to upper and lower surfaces of the piezoelectric thin film, respectively, and the filter element is a piezoelectric thin film filter element.

28. A branching filter comprising the ladder type filter of claim 16 which defines a filter having a pass-band on a higher frequency side of the branching filter.

29. A communication device comprising the branching filter of claim 28.

30. A communication device comprising the ladder type filter of claim 16.

* * * * *